(12) United States Patent
Chen et al.

(10) Patent No.: US 9,793,245 B2
(45) Date of Patent: Oct. 17, 2017

(54) SEMICONDUCTOR DEVICE AND METHOD OF MANUFACTURE

(71) Applicant: Taiwan Semiconductor Manufacturing Company, Ltd., Hsin-Chu (TW)

(72) Inventors: Hsien-Wei Chen, Hsin-Chu (TW); Ying-Ju Chen, Tuku Township (TW); An-Jhih Su, Bade (TW); Jie Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/942,859

(22) Filed: Nov. 16, 2015

(65) Prior Publication Data

US 2017/0141080 A1    May 18, 2017

(51) Int. Cl.
   *H01L 23/48*   (2006.01)
   *H01L 25/065*  (2006.01)
   *H01L 25/00*   (2006.01)

(52) U.S. Cl.
   CPC .......... *H01L 25/0657* (2013.01); *H01L 25/50* (2013.01); *H01L 2225/0651* (2013.01); *H01L 2225/06548* (2013.01); *H01L 2225/06555* (2013.01); *H01L 2225/06586* (2013.01); *H01L 2225/06596* (2013.01)

(58) Field of Classification Search
   CPC ................. H01L 25/0657; H01L 25/50; H01L 2225/0651; H01L 2225/06548
   See application file for complete search history.

(56) References Cited

U.S. PATENT DOCUMENTS

| | | | |
|---|---|---|---|
| 8,361,842 B2 | 1/2013 | Yu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 2010/0320601 A1* | 12/2010 | Pagaila ............ | H01L 21/76898 257/738 |
| 2011/0291288 A1 | 12/2011 | Wu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |

(Continued)

*Primary Examiner* — Elias M Ullah

(74) *Attorney, Agent, or Firm* — Slater Matsil, LLP

(57) ABSTRACT

A semiconductor device and method that utilize a surface device are provided. In an embodiment a fuse line comprises an underbump metallization which has two separate, electrically isolated parts. The two parts are bridged by an external connector, such as a solder ball in order to electrically connect the surface device. When, after testing, the surface device is determined to be defective, the fuse line may be disconnected by removing the external connector from the two separate parts, electrically isolating the surface device. In another embodiment the surface is located beneath a package within an integrated fan out package or is part of a multi-fan out package.

20 Claims, 17 Drawing Sheets

(56) References Cited

U.S. PATENT DOCUMENTS

| | | |
|---|---|---|
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |

\* cited by examiner

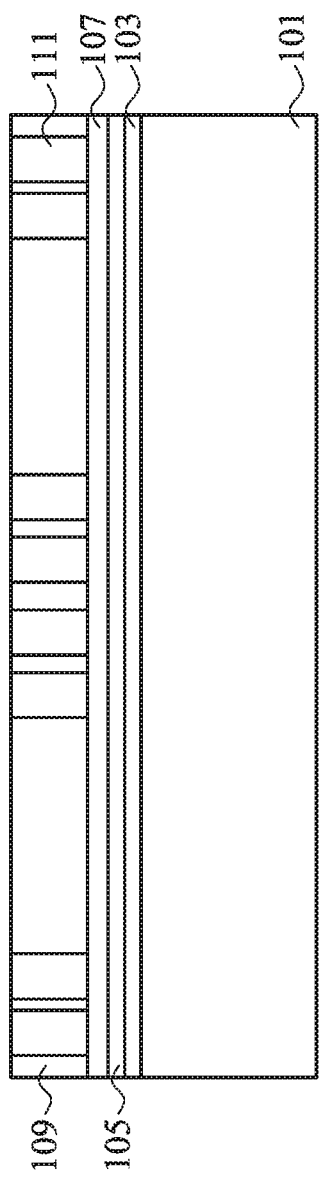
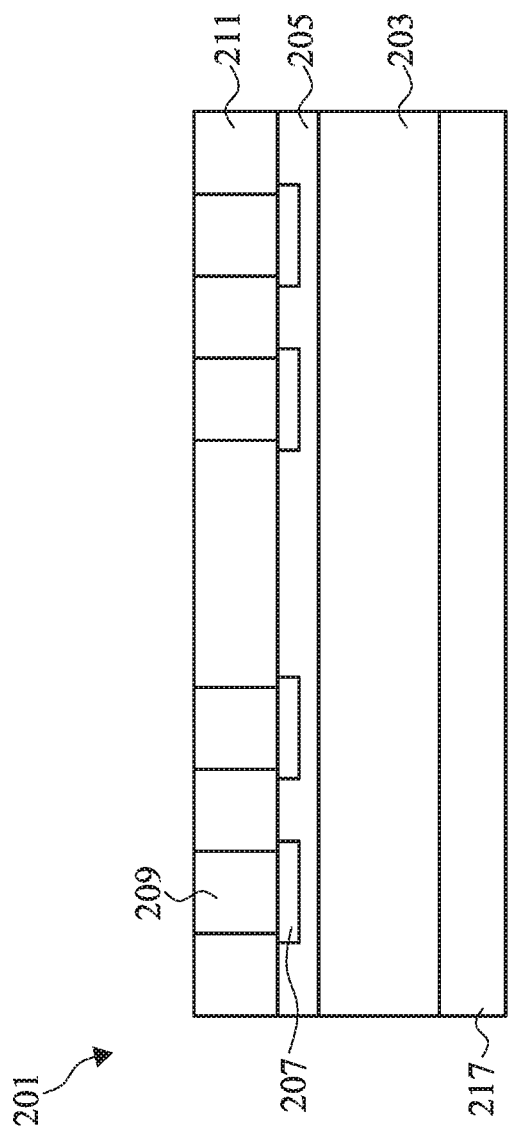

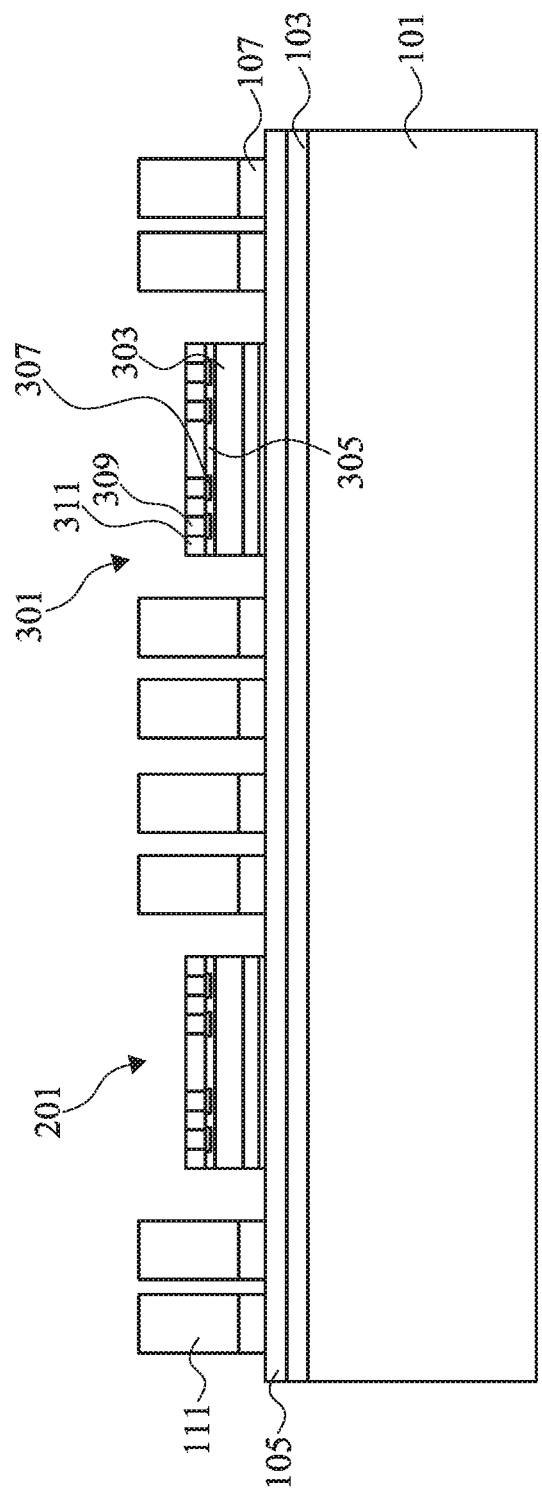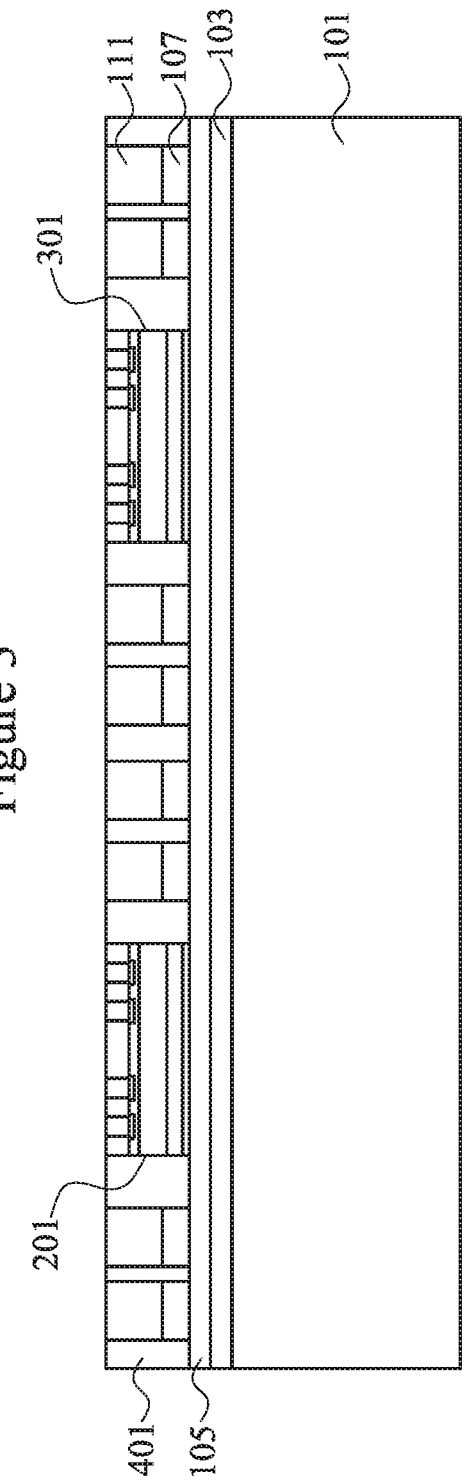
Figure 3
Figure 4

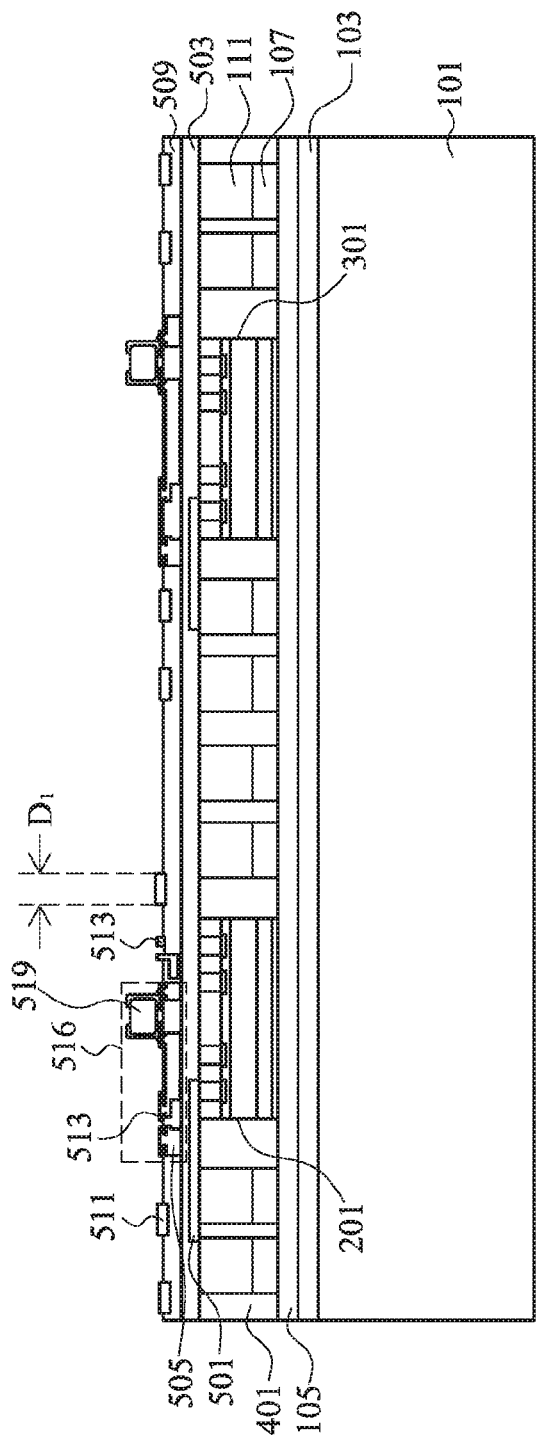
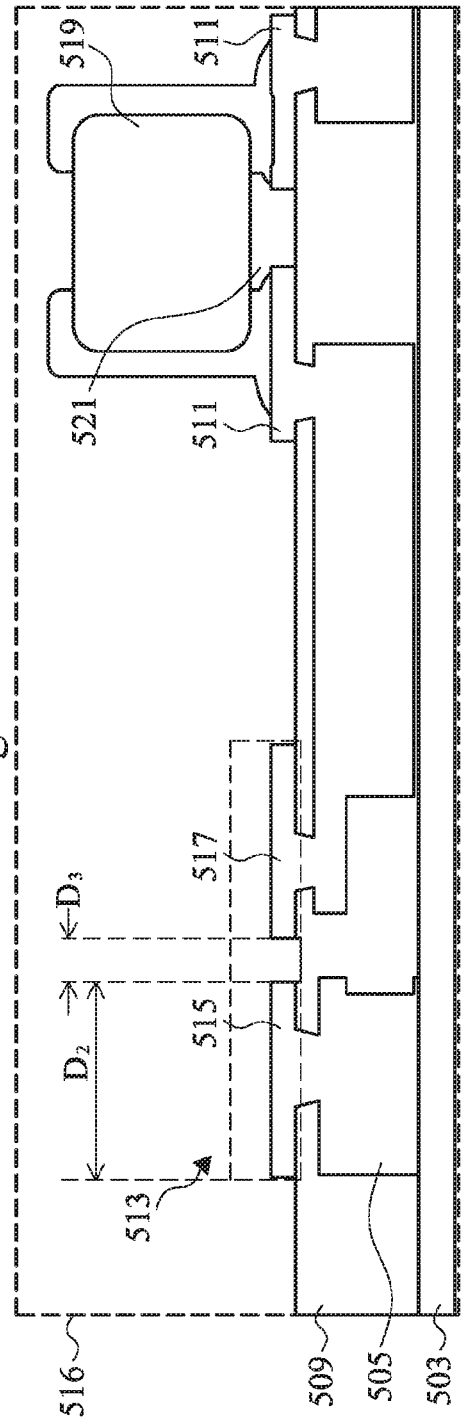
Figure 5A
Figure 5B

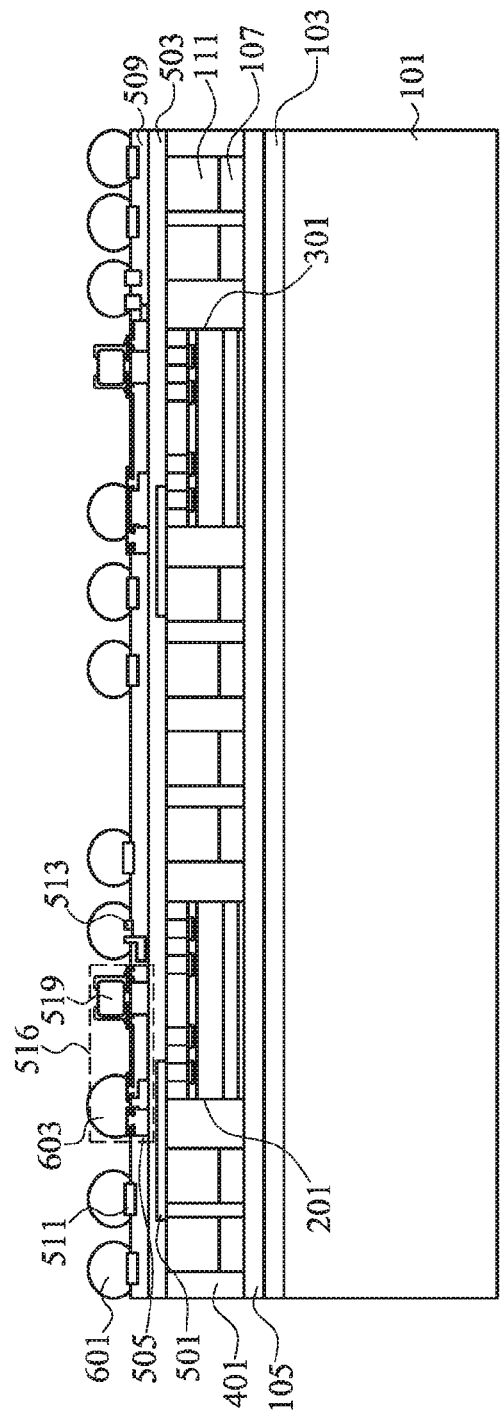
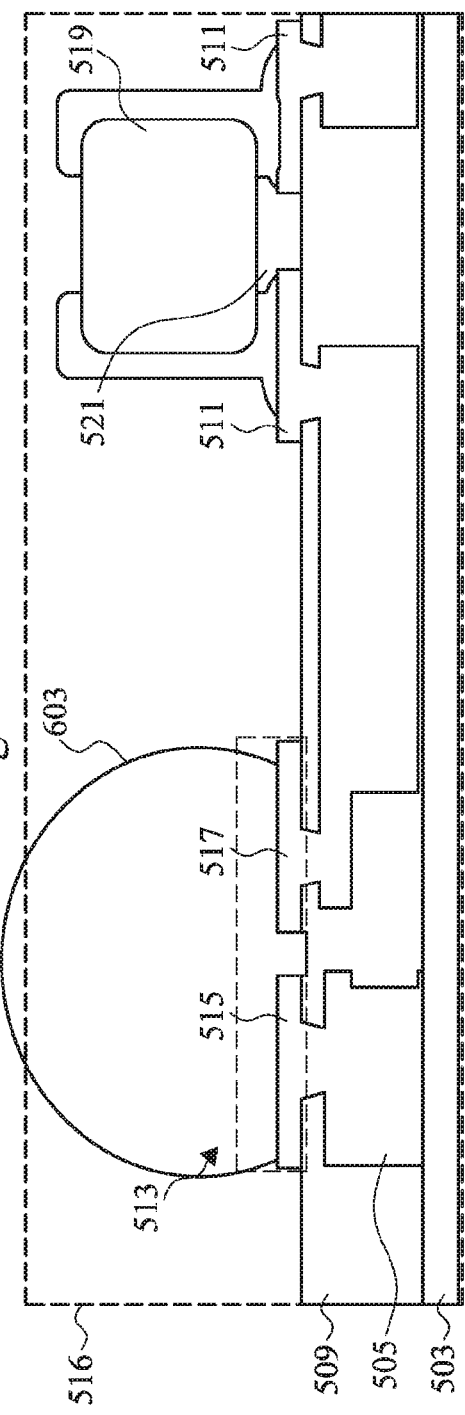
Figure 6A
Figure 6B

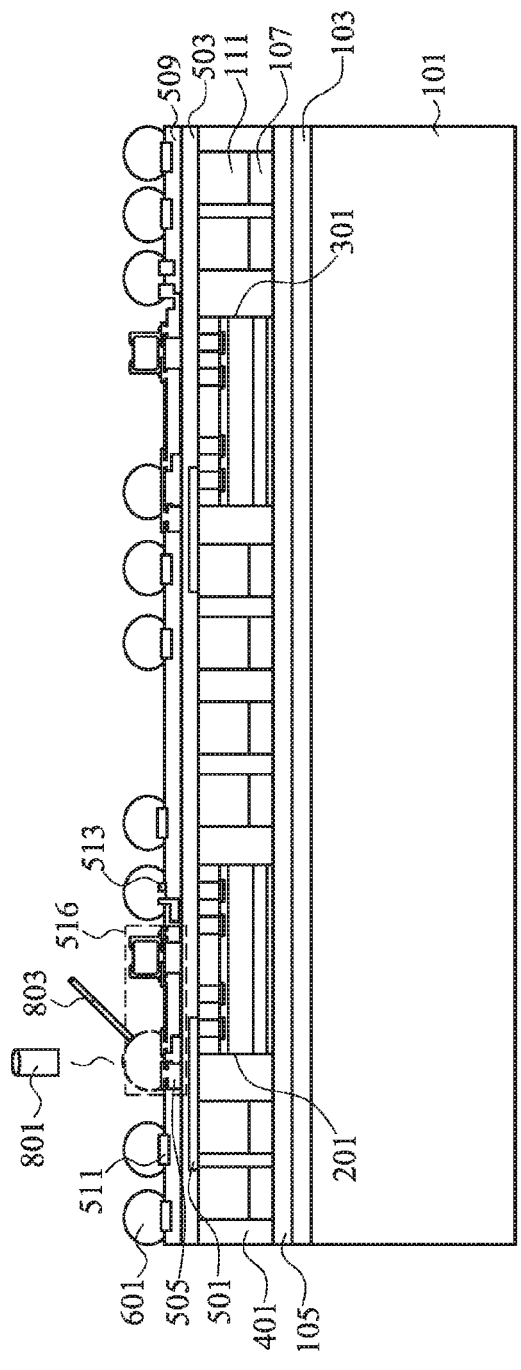
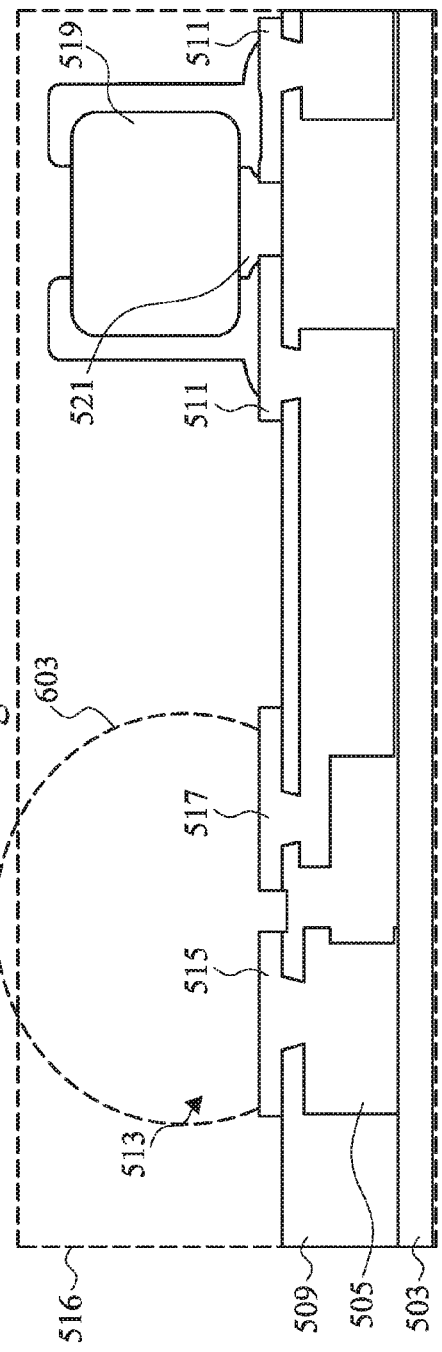
Figure 8A
Figure 8B

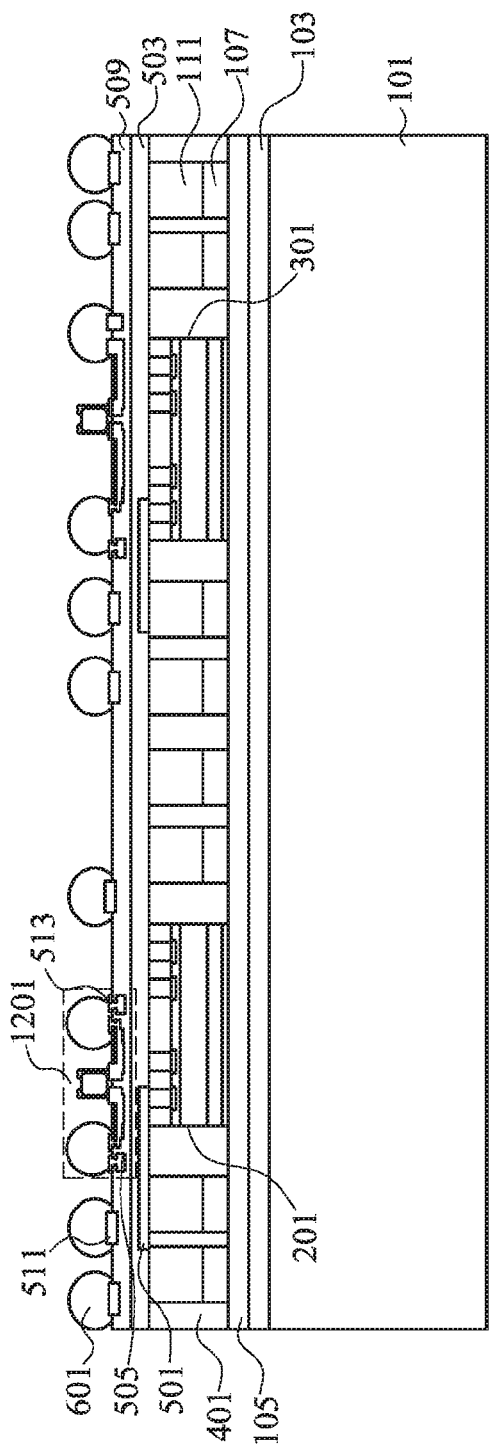
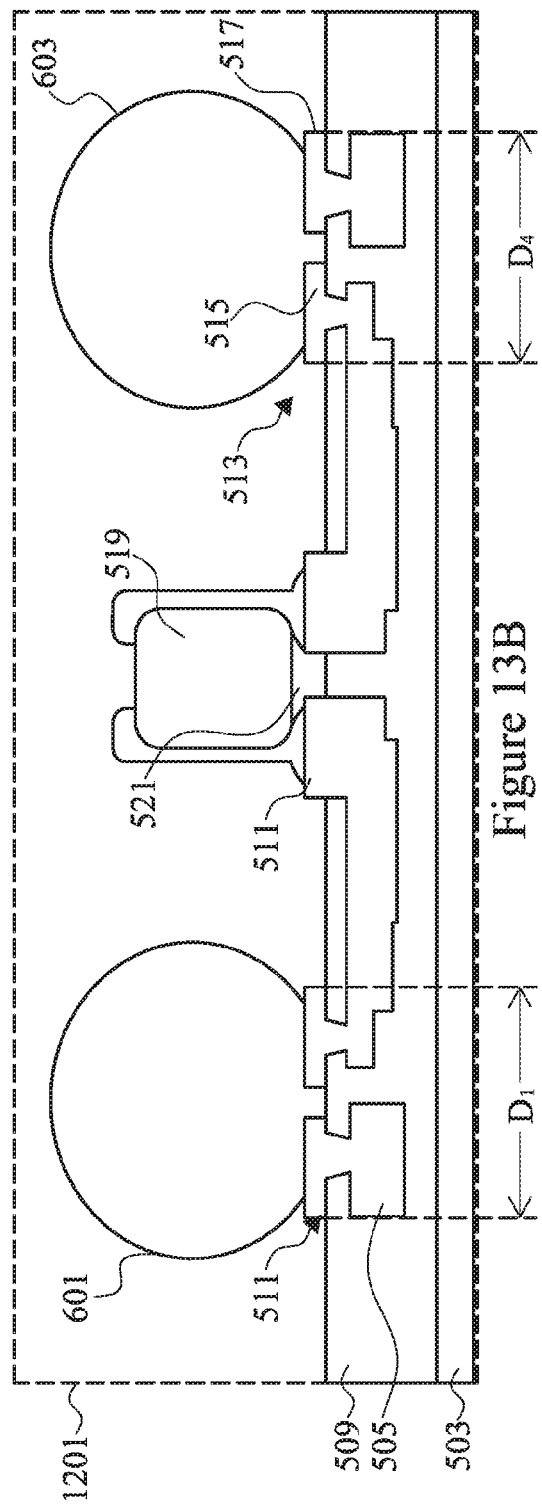
Figure 13A
Figure 13B

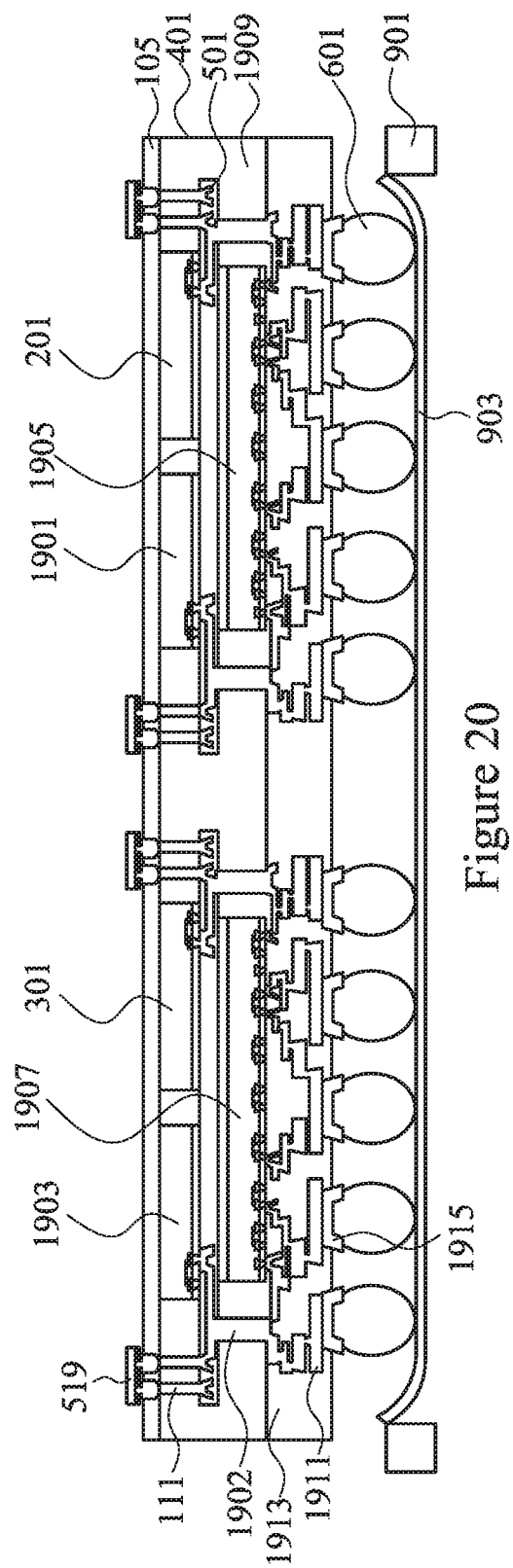
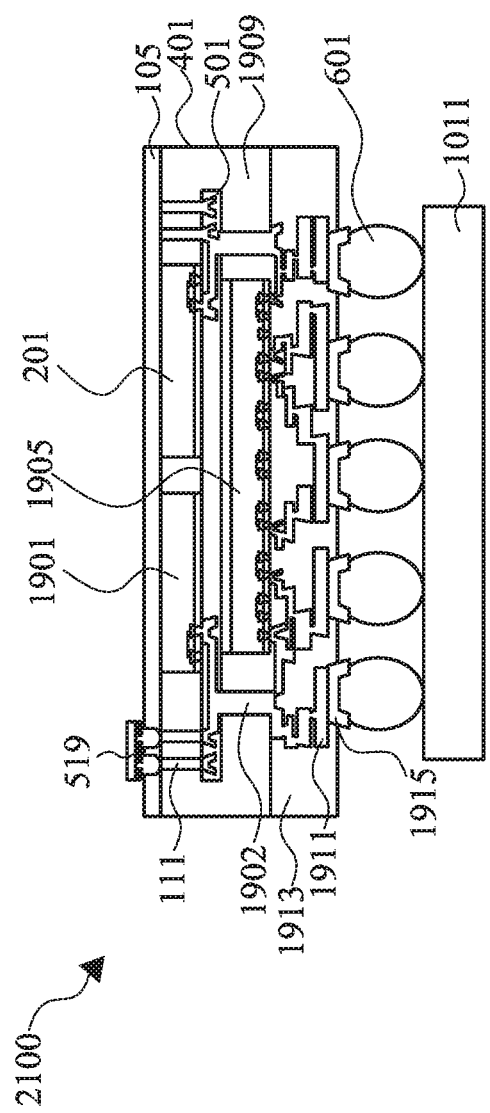
Figure 20
Figure 21

SEMICONDUCTOR DEVICE AND METHOD OF MANUFACTURE

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies may also utilize smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a formation of vias in accordance with some embodiments.

FIG. 2 illustrates a first semiconductor device in accordance with some embodiments.

FIG. 3 illustrates a placement of the first semiconductor device and a second semiconductor device in accordance with some embodiments.

FIG. 4 illustrates an encapsulation in accordance with some embodiments.

FIGS. 5A-5B illustrate a formation of terminal underbump metallizations in accordance with some embodiments.

FIGS. 6A-6B illustrate a placement of external connections in accordance with some embodiments.

FIGS. 8A-8B illustrate a removal of an external connection in accordance with some embodiments.

FIGS. 13A-13B illustrate an embodiment in which a terminal underbump metallization has a smaller dimension than another underbump metallization in accordance with some embodiments.

FIG. 20 illustrates a placement of a surface device in the multi-fan out process in accordance with some embodiments.

FIG. 21 illustrates a singulation in the multi-fan out process in accordance with some embodiments.

DETAILED DESCRIPTION

Figure 7:
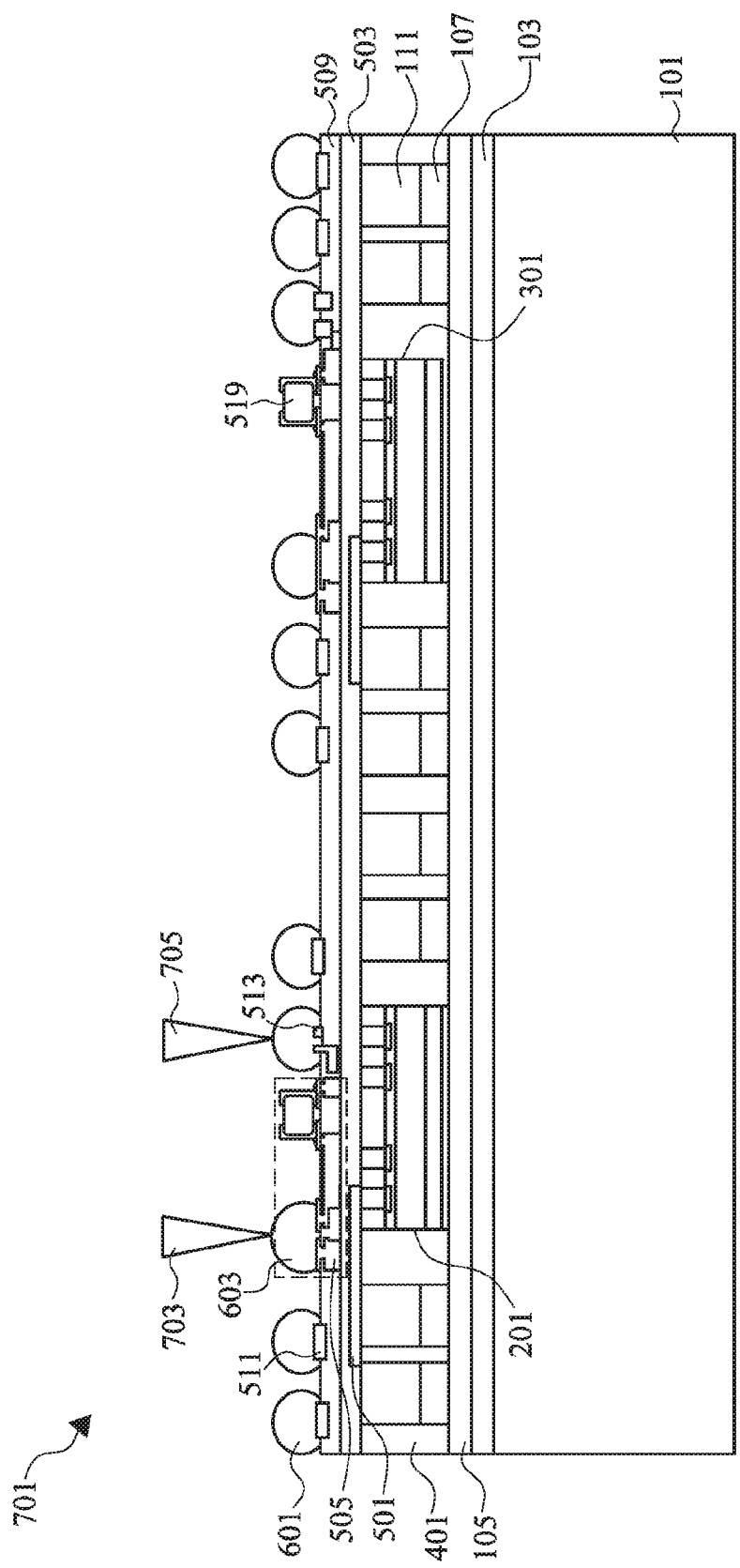
FIG. 7 illustrates a testing of a surface device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is shown a carrier substrate 101 with an adhesive layer 103, a polymer layer 105, and a first seed layer 107 over the carrier substrate 101. The carrier substrate 101 comprises, for example, silicon based materials, such as glass or silicon oxide, or other materials, such as aluminum oxide, combinations of any of these materials, or the like. The carrier substrate 101 is planar in order to accommodate an attachment of semiconductor devices such as a first semiconductor device 201 and a second semiconductor device 301 (not illustrated in FIG. 1 but illustrated and discussed below with respect to FIGS. 2-3).

The adhesive layer 103 is placed on the carrier substrate 101 in order to assist in the adherence of overlying structures (e.g., the polymer layer 105). In an embodiment the adhesive layer 103 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The adhesive layer 103 may be placed onto the carrier substrate 101 in a semi-liquid or gel form, which is readily deformable under pressure.

The polymer layer 105 is placed over the adhesive layer 103 and is utilized in order to provide protection to, e.g., the first semiconductor device 201 and the second semiconductor device 301 once the first semiconductor device 201 and the second semiconductor device 301 have been attached. In an embodiment the polymer layer 105 may be polybenzoxazole (PBO), although any suitable material, such as polyimide or a polyimide derivative, Solder Resistance (SR), or Ajinomoto build-up film (ABF) may be utilized. The polymer layer 105 may be placed using, e.g., a spin-coating process to a thickness of between about 2 µm and about 15 µm, such as about 5 µm, although any suitable method and thickness may be used.

The first seed layer 107 is formed over the polymer layer 105. In an embodiment the first seed layer 107 is a thin layer of a conductive material that aids in the formation of a thicker layer during subsequent processing steps. The first seed layer 107 may comprise a layer of titanium about 1,000 Å thick followed by a layer of copper about 5,000 Å thick. The first seed layer 107 may be created using processes such as sputtering, evaporation, or PECVD processes, depending upon the desired materials. The first seed layer 107 may be formed to have a thickness of between about 0.3 µm and about 1 µm, such as about 0.5 µm.

FIG. 1 also illustrates a placement and patterning of a photoresist 109 over the first seed layer 107. In an embodiment the photoresist 109 may be placed on the first seed layer 107 using, e.g., a spin coating technique to a height of between about 50 µm and about 250 µm, such as about 120 µm. Once in place, the photoresist 109 may then be patterned by exposing the photoresist 109 to a patterned energy source (e.g., a patterned light source) so as to induce a chemical reaction, thereby inducing a physical change in those portions of the photoresist 109 exposed to the patterned light source. A developer is then applied to the exposed photoresist 109 to take advantage of the physical changes and selectively remove either the exposed portion of the photoresist 109 or the unexposed portion of the photoresist 109, depending upon the desired pattern.

In an embodiment the pattern formed into the photoresist 109 is a pattern for first vias 111. The first vias 111 are formed in such a placement as to be located on different sides of subsequently attached devices such as the first semiconductor device 201 and the second semiconductor device 301. However, any suitable arrangement for the pattern of first vias 111, such as by being located such that the first semiconductor device 201 and the second semiconductor device 301 are placed on opposing sides of the first vias 111, may be utilized.

Once the photoresist has been patterned, the first vias 111 are formed within the photoresist 109. In an embodiment the first vias 111 comprise one or more conductive materials, such as copper, tungsten, other conductive metals, or the like, and may be formed, for example, by electroplating, electroless plating, or the like. In an embodiment, an electroplating process is used wherein the first seed layer 107 and the photoresist 109 are submerged or immersed in an electroplating solution. The first seed layer 107 surface is electrically connected to the negative side of an external DC power supply such that the first seed layer 107 functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer 107, acquires the dissolved atoms, thereby plating the exposed conductive areas of the first seed layer 107 within the opening of the photoresist 109.

Once the first vias 111 have been formed using the photoresist 109 and the first seed layer 107, the photoresist 109 may be removed using a suitable removal process (not illustrated in FIG. 1 but seen in FIG. 3 below). In an embodiment, a plasma ashing process may be used to remove the photoresist 109, whereby the temperature of the photoresist 109 may be increased until the photoresist 109 experiences a thermal decomposition and may be removed. However, any other suitable process, such as a wet strip, may be utilized. The removal of the photoresist 109 may expose the underlying portions of the first seed layer 107.

Once exposed a removal of the exposed portions of the first seed layer 107 may be performed (not illustrated in FIG. 1 but seen in FIG. 3 below). In an embodiment the exposed portions of the first seed layer 107 (e.g., those portions that are not covered by the first vias 111) may be removed by, for example, a wet or dry etching process. For example, in a dry etching process reactants may be directed towards the first seed layer 107 using the first vias 111 as masks. In another embodiment, etchants may be sprayed or otherwise put into contact with the first seed layer 107 in order to remove the exposed portions of the first seed layer 107. After the exposed portion of the first seed layer 107 has been etched away, a portion of the polymer layer 105 is exposed between the first vias 111.

FIG. 2 illustrates a first semiconductor device 201 that will be attached to the polymer layer 105 within the first vias 111 (not illustrated in FIG. 2 but illustrated and described below with respect to FIG. 3). In an embodiment the first semiconductor device 201 comprise a first substrate 203, first active devices (not individually illustrated), first metallization layers 205, first contact pads 207, a first passivation layer 211, and first external connectors 209. The first substrate 203 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional parameters of the design for the first semiconductor device 201. The first active devices may be formed using any suitable methods either within or else on the first substrate 203.

The first metallization layers 205 are formed over the first substrate 203 and the first active devices and are designed to connect the various active devices to form functional circuitry. In an embodiment the first metallization layers 205 are formed of alternating layers of dielectric and conductive material and may be formed through any suitable process (such as deposition, damascene, dual damascene, etc.). In an embodiment there may be four layers of metallization separated from the first substrate 203 by at least one interlayer dielectric layer (ILD), but the precise number of first metallization layers 205 is dependent upon the design of the first semiconductor device 201.

The first contact pads 207 may be formed over and in electrical contact with the first metallization layers 205. The first contact pads 207 may comprise aluminum, but other materials, such as copper, may be used. The first contact pads 207 may be formed using a deposition process, such as sputtering, to form a layer of material (not shown) and portions of the layer of material may then be removed through a suitable process (such as photolithographic masking and etching) to form the first contact pads 207. However, any other suitable process may be utilized to form the first contact pads 207. The first contact pads may be formed to have a thickness of between about 0.5 µm and about 4 µm, such as about 1.45 µm.

The first passivation layer 211 may be formed on the first substrate 203 over the first metallization layers 205 and the first contact pads 207. The first passivation layer 211 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 211 may be formed through a process such as chemical vapor deposition (CVD), although any suitable process may be utilized, and may have a thickness between about 0.5 µm and about 5 µm, such as about 9.25 KÅ.

The first external connectors 209 may be formed to provide conductive regions for contact between the first contact pads 207 and, e.g., a first redistribution layer 501 (not illustrated in FIG. 2 but illustrated and described below with respect to FIG. 5). In an embodiment the first external connectors 209 may be conductive pillars and may be formed by initially forming a photoresist (not shown) over the first passivation layer 211 to a thickness between about 5 µm to about 20 µm, such as about 10 µm. The photoresist may be patterned to expose portions of the first passivation layer 211 through which the conductive pillars will extend. Once patterned, the photoresist may then be used as a mask to remove the desired portions of the first passivation layer 211, thereby exposing those portions of the underlying first contact pads 207 to which the first external connectors 209 will make contact.

The first external connectors 209 may be formed within the openings of both the first passivation layer 211 and the photoresist. The first external connectors 209 may be formed from a conductive material such as copper, although other conductive materials such as nickel, gold, or metal alloy, combinations of these, or the like may also be used. Additionally, the first external connectors 209 may be formed using a process such as electroplating, by which an electric current is run through the conductive portions of the first contact pads 207 to which the first external connectors 209 are desired to be formed, and the first contact pads 207 are immersed in a solution. The solution and the electric current deposit, e.g., copper, within the openings in order to fill and/or overfill the openings of the photoresist and the first passivation layer 211, thereby forming the first external connectors 209. Excess conductive material and photoresist outside of the openings of the first passivation layer 211 may then be removed using, for example, an ashing process, a chemical mechanical polish (CMP) process, combinations of these, or the like.

However, as one of ordinary skill in the art will recognize, the above described process to form the first external connectors 209 is merely one such description, and is not meant to limit the embodiments to this exact process. Rather, the described process is intended to be merely illustrative, as any suitable process for forming the first external connectors 209 may be utilized. All suitable processes are fully intended to be included within the scope of the present embodiments.

FIG. 3 illustrates a placement of the first semiconductor device 201 onto the polymer layer 105 along with a placement of a second semiconductor device 301. In an embodiment the second semiconductor device 301 may comprise a second substrate 303, second active devices (not individually illustrated), second metallization layers 305, second contact pads 307, a second passivation layer 311, and second external connectors 309. In an embodiment the second substrate 303, the second active devices, the second metallization layers 305, the second contact pads 307, the second passivation layer 311, and the second external connectors 309 may be similar to the first substrate 203, the first active devices, the first metallization layers 205, the first contact pads 207, the first passivation layer 211, and the first external connectors 209, although they may also be different.

In an embodiment the first semiconductor device 201 and the second semiconductor device 301 may be placed onto the polymer layer 105 using, e.g., a pick and place process. However, any other alternative method of placing the first semiconductor device 201 and the second semiconductor device 301 may be used to place the first semiconductor device 201 and the second semiconductor device 301 onto the polymer layer 105 and within the first vias 111.

FIG. 4 illustrates an encapsulation of the first vias 111, the first semiconductor device 201 and the second semiconductor device 301. The encapsulation may be performed in a molding device (not individually illustrated in FIG. 4), which may comprise a top molding portion and a bottom molding portion separable from the top molding portion. When the top molding portion is lowered to be adjacent to the bottom molding portion, a molding cavity may be formed for the carrier substrate 101, the first vias 111, the first semiconductor device 201, and the second semiconductor device 301.

During the encapsulation process the top molding portion may be placed adjacent to the bottom molding portion, thereby enclosing the carrier substrate 101, the first vias 111, the first semiconductor device 201, and the second semiconductor device 301 within the molding cavity. Once enclosed, the top molding portion and the bottom molding portion may form an airtight seal in order to control the influx and outflux of gasses from the molding cavity. Once sealed, a first encapsulant 401 may be placed within the molding cavity. The first encapsulant 401 may be a molding compound resin such as polyimide, PPS, PEEK, PES, a heat resistant crystal resin, combinations of these, or the like. The first encapsulant 401 may be placed within the molding cavity prior to the alignment of the top molding portion and the bottom molding portion, or else may be injected into the molding cavity through an injection port.

Once the first encapsulant 401 has been placed into the molding cavity such that the first encapsulant 401 encapsulates the carrier substrate 101, the first vias 111, the first semiconductor device 201, and the second semiconductor device 301, the first encapsulant 401 may be cured in order to harden the first encapsulant 401 for optimum protection. While the exact curing process is dependent at least in part on the particular material chosen for the first encapsulant 401, in an embodiment in which molding compound is chosen as the first encapsulant 401, the curing could occur through a process such as heating the first encapsulant 401 to between about 100° C. and about 130° C., such as about 125° C. for about 60 sec to about 3000 sec, such as about 600 sec. Additionally, initiators and/or catalysts may be included within the first encapsulant 401 to better control the curing process.

However, as one having ordinary skill in the art will recognize, the curing process described above is merely an exemplary process and is not meant to limit the current embodiments. Other curing processes, such as irradiation or even allowing the first encapsulant 401 to harden at ambient temperature, may be used. Any suitable curing process may be used, and all such processes are fully intended to be included within the scope of the embodiments discussed herein.

FIG. 4 also illustrates a thinning of the first encapsulant 401 in order to expose the first vias 111, the first semiconductor device 201, and the second semiconductor device 301 for further processing. The thinning may be performed, e.g., using a mechanical grinding or chemical mechanical polishing (CMP) process whereby chemical etchants and abrasives are utilized to react and grind away the first encapsulant 401, the first semiconductor device 201 and the second semiconductor device 301 until the first vias 111, the first external connectors 209 (on the first semiconductor device 201), and the second external connectors 309 (on the second semiconductor device 301) have been exposed. As such, the first semiconductor device 201, the second semiconductor device 301, and the first vias 111 may have a planar surface that is also planar with the first encapsulant 401.

However, while the CMP process described above is presented as one illustrative embodiment, it is not intended to be limiting to the embodiments. Any other suitable removal process may be used to thin the first encapsulant 401, the first semiconductor device 201, and the second semiconductor device 301 and expose the first vias 111. For example, a series of chemical etches may be utilized. This process and any other suitable process may be utilized to thin the first encapsulant 401, the first semiconductor device 201, and the second semiconductor device 301, and all such processes are fully intended to be included within the scope of the embodiments.

Optionally, after the first encapsulant 401 has been thinned, the first vias 111 and the first external connectors 209 may be recessed within the first encapsulant 401. In an embodiment the first vias 111 and the first external connectors 209 may be recessed using, e.g., an etching process that utilizes an etchant that is selective to the material of the first vias 111 and the first external connectors 209 (e.g., copper). The first vias 111 and the first external connectors 209 may be recessed to a depth of between about 20 µm and about 300 µm, such as about 180 µm.

FIGS. 5A-5B illustrate a formation of a first redistribution layer (RDL) 501 in order to interconnect the first semiconductor device 201, the second semiconductor device 301, the first vias 111, third external connectors 601, and fourth external connectors 603 (not illustrated in FIG. 5A but illustrated and described below with respect to FIGS. 6A-6B), with FIG. 5B being a close-up view of the dashed box 516 in FIG. 5A. In an embodiment the first RDL 501 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the first RDL 501 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 5 µm. However, while the material and methods discussed are suitable to form the conductive material, these materials are merely exemplary. Any other suitable materials, such as AlCu or Au, and any other suitable processes of formation, such as CVD or PVD, may be used to form the first RDL 501.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

FIG. 5A also illustrates a formation of a third passivation layer 503 over the first RDL 501 in order to provide protection and isolation for the first RDL 501 and the other underlying structures. In an embodiment the third passivation layer 503 may be polybenzoxazole (PBO), although any suitable material, such as polyimide or a polyimide derivative, may be utilized. The third passivation layer 503 may be placed using, e.g., a spin-coating process to a thickness of between about 5 µm and about 25 µm, such as about 7 µm, although any suitable method and thickness may be used.

Additionally, while FIG. 5A only illustrates a single first RDL 501 and a single third passivation layer 503, this is done for clarity and is not intended to limit the embodiments. Rather, the above processes to form the single first RDL 501 and the single third passivation layer 503 may be repeated one or more times to form a plurality of electrically interconnected RDLs and passivation layers as desired. Any suitable number of RDLs may be utilized.

Additionally, after forming the first RDL 501 and the third passivation layer 503 (and repeating the process as desired to form any suitable number of RDLs), a terminal RDL 505 may be formed in electrical connection with the rest of the structure such as the first RDL 501. In an embodiment the terminal RDL 505 is formed in order to provide a conductive routing layer that provides electrical connection to external connections and devices (such as the surface devices 519, described further below). In an embodiment the terminal RDL 505 is formed using similar materials and processes as the first RDL 501. For example, the terminal RDL 505 may be formed of a material such as copper using a process such as electroplating, although any suitable materials and methods of manufacture may be utilized.

Once the terminal RDL 505 has been formed, a fourth passivation layer 509 may be formed over the terminal RDL 505 in order to isolate and protect the terminal RDL 505. In an embodiment the fourth passivation layer 509 may be formed of similar material and using similar processes as the third passivation layer 503, such as by being PBO applied using a spin-coating process, although any suitable material and method of manufacture may be utilized.

Once the fourth passivation layer 509 has been formed, openings through the fourth passivation layer 509 may be formed to expose portions of the terminal RDL 505. In an embodiment the openings through the fourth passivation layer 509 may be formed using, e.g., a photolithographic masking and etching process, whereby a photosensitive material is applied, exposed, and developed to form a mask, and the mask is utilized along with an etching process, such as a reactive ion etch, in order to remove exposed portions of the fourth passivation layer 509. However, any suitable exposure process may be used to form the openings through the fourth passivation layer 509.

FIG. 5A also illustrates a formation of first underbump metallizations (UBM) 511 and terminal UBMs 513 within the openings through the fourth passivation layer 509 and in electrical connection with the terminal RDL 505. In an embodiment the first UBMs 511 are utilized in order to connect the package with external devices, such as other packages or other semiconductor devices (not separately illustrated in FIG. 5A) while the terminal UBMs 513 are utilized to provide either connectivity to external devices (similar to the first UBMs 511) but also to form a fuse line that may be opened or closed based upon the presence or absence of the fourth external connectors 603 (not illustrated in FIG. 5A but illustrated and described below with respect to FIGS. 6A-6B).

In an embodiment the first UBMs 511 and terminal UBMs 513 may each comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the first UBMs 511 and terminal UBMs 513. Any suitable materials or layers of material that may be used for the first UBMs 511 and terminal UBMs 513 are fully intended to be included within the scope of the embodiments.

In an embodiment the first UBMs 511 and terminal UBMs 513 are created by forming each layer over the terminal RDL 505 and along the interior of the openings through the fourth passivation layer 509. The forming of each layer may be performed using a plating process, such as electrochemical plating, although other processes of formation, such as sputtering, evaporation, or PECVD process, may be used depending upon the desired materials. The first UBMs 511 and terminal UBMs 513 may be formed to have a thickness of between about 0.7 µm and about 10 µm, such as about 5 µm. Additionally, the first UBMs 511 may be formed in a circular shape (in a top down view) that has a diameter with a first distance $D_1$ of between about 150 µm and about 250 µm, although any suitable shape or dimension may be used.

FIG. 5B illustrates a close-up view of the dashed box 516 in FIG. 5A and provides a closer look at the terminal UBMs 513. In an embodiment, the terminal UBMs 513 may be formed to also be in a circular shape (when viewed from the top down). However, in order to function as a fuse line, the terminal UBMs 513 may be formed with a first section 515 and a second section 517 that are each electrically in contact with separate portions of the terminal RDL 505 but are electrically isolated from each other so that another connector (such as the fourth external connectors 603, discussed further below) may be used to bridge the distance and electrically connect the first section 515 and the second section 517 to form the fuse line.

In a particular embodiment the first section 515 and the second section 517 may each be shaped as half-circles which are complementary to each other and wherein the half-circles may have a radius with a second distance $D_2$ of between about 100 µm and about 1000 µm. Additionally, as described, the first section 515 and the second section 517 are separated from each other in order to electrically isolate the first section 515 from the second section 517 at this stage of manufacture. As such, the first section 515 may be isolated from the second section 517 by a third distance $D_3$ of between about 10 µm and about 50 µm, such as about 20 µm. However, any suitable shapes, whether complementary or not, and any suitable dimensions, may be utilized to form the first section 515 and the second section 517 and form the terminal UBMs 513.

FIGS. 5A-5B also illustrate the placement and bonding of surface devices 519 that may be used to provide additional functionality or programming to the first semiconductor device 201, the second semiconductor device 301, or the package as a whole. In an embodiment the surface devices 519 may be surface mount devices (SMD) or integrated passive devices (IPD) that comprise passive devices such as resistors, inductors, capacitors, jumpers, combinations of these, or the like that are desired to be connected to and utilized in conjunction with the first semiconductor device 201 or the second semiconductor device 301, or other parts of the package.

In an embodiment, the surface devices 519 are connected between separate first UBMs 511 that connect to separate portions of the terminal RDL 505. Additionally, that portion of the terminal RDL 505 that is electrically connected to one of the surface devices 519 is additionally connected to one or more of the terminal UBMs 513 within the fuse line such that the surface devices 519 can be, if desired and as discussed further below, connected or disconnected from the remainder of the structure through the use of the terminal UBMs 513.

The surface devices 519 may be connected to the first UBMs 511, for example, by sequentially dipping connectors such as solder balls of the surface device 519 into flux, and then using a pick-and-place tool in order to physically align the connectors of the surface device 519 with individual ones of the first UBMs 511. In an embodiment in which the surface devices 519 use connectors such as solder balls, once the surface devices 519 have been placed a reflow process may be performed in order to physically bond the surface device 519 with the underlying first UBMs 511 and a flux clean may be performed. However, any other suitable connector or connection process may be utilized, such as metal-to-metal bonding or the like.

Once the surface devices 519 have been bonded to the first UBMs 511, an underfill material 521 may be placed between the surface device 519 and the fourth passivation layer 509 in order to help protect and isolate the surface device 519 that has been bonded. In an embodiment the underfill material 521 is a protective material used to cushion and support the surface devices 519 from operational and environmental degradation, such as stresses caused by the generation of heat during operation. The underfill material 521 may be injected or otherwise formed in the space between the surface devices 519 and the fourth passivation layer 509 and may, for example, comprise a liquid epoxy that is dispensed between the surface devices 519 and the fourth passivation layer 509, and then cured to harden.

FIGS. 6A-6B illustrate a placement of third external connectors 601 onto the first UBMs 511 and a placement of fourth external connectors 603 onto the terminal UBMs 513, with FIG. 6B illustrating a close-up view of the dashed box 516 in FIG. 6A. In an embodiment the third external connectors 601 and the fourth external connectors 603 may be placed at the same time and may be, e.g., a ball grid array and may comprise a eutectic material such as solder, although any suitable materials may be used. In an embodiment in which the third external connectors 601 and the fourth external connectors 603 are solder balls, the third external connectors 601 and the fourth external connectors 603 may be formed using a ball drop method to place the third external connectors 601 and the fourth external connectors 603 onto the first UBMs 511 and the terminal UBMs 513, such as a direct ball drop process. In another embodiment, the third external connectors 601 and the fourth external connectors 603 may be formed by initially forming a layer of tin through any suitable method such as evaporation, electroplating, printing, solder transfer, and then performing a reflow is performed in order to shape the material into the desired bump shape.

By placing the third external connectors 601 onto the first UBMs 511, the third external connectors 601 are physically and electrically in place to provide an external connection to external devices. In particular, by placing external devices in physical connection with the third external connectors 601 and then performing a reflow, the third external connectors 601 can physically and electrically bond the package to another device, as described further below.

Additionally, with the placement of the fourth external connectors 603 onto the terminal UBMs 513, the fourth external connectors 603 may, if desired, provide a similar external connection as the third external connectors 601. However, in addition to providing an external connection, the fourth external connectors 603 will also bridge the separation between the first section 515 of the fourth external connectors 603 and the second section 517 of the fourth external connectors 603 and act as a switch in order to electrically connect the first section 515 to the second section 517. This electrical connection will serve to electrically connect the surface device 519 to the rest of the package, such as the first semiconductor device 201, the first vias 111, and the third external connectors 601, depending upon the desired routing of the terminal RDL 505 and the first RDL 501.

Additionally, if desired, the third external connectors 601, the fourth external connectors 603, and the surface devices 519 may be placed and bonded using a same process. In particular, in an embodiment in which the surface devices 519 use solder to bond to the UBMs 511, the surface devices 519, the third external connectors 601, and the fourth external connectors 603 may all be placed at the same time and then reflowed at the same time. By doing a single reflow, process integration and energy efficiencies may be obtained.

FIG. 7 illustrates a test performed on the surface device 519 in order to determine if the surface device 519 is operable after the placement and bonding and that no other defects, such as a bridge between surface device terminals that may kill the desired functionality, are present. In an embodiment the test may be performed using a test apparatus 701 that comprises a first terminal 703 (for, e.g., a power connection) and a second terminal 705 (for, e.g., a ground connection). In an embodiment the first terminal 703 may be placed in contact with one of the fourth external connectors 603 on a first side of the surface device 519 and the second terminal 705 may be placed in contact with either another fourth external connectors 603 on an opposite side (electrically) of the surface device 519 or in contact electrically with a third external connector 601 on an opposite side (electrically) of the surface device 519, thereby completing a circuit from the second terminal 705 through the surface device 519 and back to the first terminal 703.

With these connections, a current may be applied to the second terminal 705 and the current's change through the surface device 519 may be received by the first terminal 703 and measured by the test apparatus 701. Similarly, a voltage may be applied to the second terminal 705 and the voltage's change through the surface device 519 may be received by the first terminal 703 and measured by the test apparatus 701. The changes of the current and the voltage through the surface device 519 may then be analyzed to determine if there is a defect within the surface device 519 that may affect the overall electrical performance of the surface device 519 and the package in general.

However, as one of ordinary skill in the art will recognize, the two terminal test to measure both current and voltage is merely one embodiment and is not intended to limit the embodiments. Any suitable test using any number of terminals may be utilized. Any combination of the number of terminals and the desired tests to be run on the surface device 519 is fully intended to be included within the scope of the embodiments.

FIGS. 8A-8B illustrate an embodiment in which the surface device 519 fails the test described above with respect to FIG. 7, in which FIG. 8B illustrates a close-up view of the dashed box 516 in FIG. 8A. In this embodiment, because the surface device 519 has already been bonded and the underfill material 521 has been placed and hardened, it is extremely inefficient to remove and replace the surface device 519. Additionally, because copper lines or traces are relatively large, it is difficult to burn these lines or traces out by a laser. However, there are situations in which it is acceptable to simply disconnect and deactivate the defective surface device 519 electrically and move the remainder of the structure (e.g., the first semiconductor device 201, the first vias 111, etc.) to further processing while the surface device 519 remains physically attached.

In such an embodiment, the fourth external connectors 603 may be selectively removed (illustrated by the dashed line that indicated where the fourth external connectors 603 were located prior to removal) from the terminal UBMs 513 in order to electrically separate the first section 515 of the terminal UBMs 513 from the second section 517 of the terminal UBMs 513. Such a removal opens the fuse line that electrically connects the surface device 519 from the remainder of the structure and electrically disconnects the surface device 519. However, the surface device 519 is not physically removed from the structure.

In an embodiment in which the fourth external connectors 603 are solder balls, the desired fourth external connector 603 may be removed using, e.g., a desoldering process whereby the fourth external connector 603 is heated in a selective reflow process and then removed while the fourth external connector 603 is in a flowable state. In an embodiment the fourth external connector 603 may be heated to a temperature at which it flows using a heat gun (represented in FIG. 8A by the gun labeled 801) or other selective heating element that can selectively apply heat to the desired fourth external connector 603 without reflowing adjacent fourth external connectors 603 or adjacent third external connectors 601. In an embodiment in which the fourth external connector 603 is solder, the heat gun may be used to increase the temperature above the reflow point, such as above about 225° C.

However, while a heat gun is one tool that may be used to reflow the fourth external connector 603 for removal, this is intended to be illustrative only and is not intended to be limiting. Rather, any suitable device or method, or combination of devices and methods, that may be used to selectively reflow the desired fourth external connector 603 may also be used. All such devices and methods are fully intended to be included within the scope of the embodiments.

Once the temperature of the fourth external connector 603 has been raised to a point where it will reflow, the now flowable fourth external connector 603 may be removed from the terminal UBM 513. In an embodiment the fourth external connector 603 may be removed using a suction pump (represented in FIG. 8 by the tube labeled 803), whereby a tube has one end in contact with the fourth external connector 603 and another end that is attached to a suction device to lower the pressure within the tube. With a lowered pressure, the flowable fourth external connector 603 is moved into the tube by the pressure difference between the ambient atmosphere outside of the tube and the reduced pressure within the tube. In an embodiment the pressure within the tube may be reduced to a pressure of between about 0.1 atm and about 1 atm, and the tube may have an opening with a diameter of between about 30 μm and about 300 μm.

However, while the suction pump 803 is one such device that may be used to help remove the fourth external connector 603, this description is intended to be illustrative and is not intended to be limiting. Rather, any suitable device or method, such as a desoldering braid (which uses capillary action to help remove solder) or a sheer mechanical removal, may be used. All such methods and devices are fully intended to be included within the scope of the embodiments.

By removing the fourth external connector 603, the surface device 519 may be electrically disconnected and isolated from the other components without requiring the costly and inefficient process of physically debonding and removing the surface device 519 and underfill material 521. As such, a more efficient process may be obtained when a remainder of the structure may still be useful without the surface device 519 being connected.

If, however, the test performed with the test apparatus 701 indicates that the surface device 519 is fully operational, then the fourth external connectors 603 may be left on the terminal UBMs 513. By leaving the fourth external connectors 603 on the terminal UBMs 513, the fuse line is keep complete. This complete fuse line keeps the surface device 519 electrically connected to the remainder of the structures, such as the first vias 111, the first semiconductor device 201, and/or the second semiconductor device 301, as desired.

Figure 9:
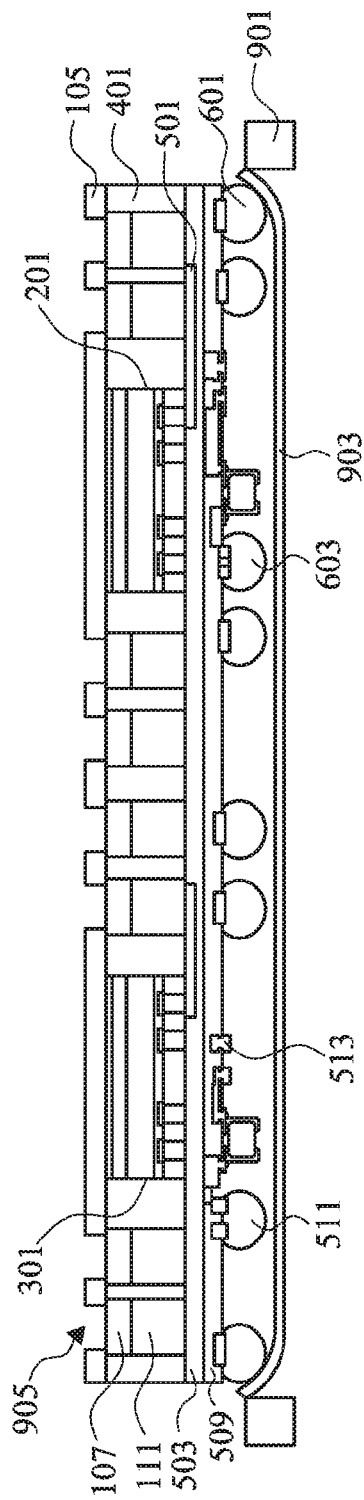
FIG. 9 illustrates a patterning of a polymer layer in accordance with some embodiments.

FIG. 9 illustrates a debonding of the carrier substrate 101 from the first semiconductor device 201 and the second semiconductor device 301. In an embodiment the third external connectors 601 and the fourth external connectors 603 and, hence, the structure including the first semiconductor device 201 and the second semiconductor device 301, may be attached to a ring structure 901. The ring structure 901 may be a metal ring intended to provide support and stability for the structure during and after the debonding process. In an embodiment the third external connectors 601, the fourth external connectors 603, the first semiconductor device 201, and the second semiconductor device 301 are attached to the ring structure using, e.g., a ultraviolet tape 903, although any other suitable adhesive or attachment may be used.

Once the third external connectors 601 and the fourth external connectors 603, and hence, the structure including the first semiconductor device 201 and the second semiconductor device 301 are attached to the ring structure 901, the carrier substrate 101 may be debonded from the structure including the first semiconductor device 201 and the second semiconductor device 301 using, e.g., a thermal process to alter the adhesive properties of the adhesive layer 103. In a particular embodiment an energy source such as an ultraviolet (UV) laser, a carbon dioxide ($CO_2$) laser, or an infrared (IR) laser, is utilized to irradiate and heat the adhesive layer 103 until the adhesive layer 103 loses at least some of its adhesive properties. Once performed, the carrier substrate 101 and the adhesive layer 103 may be physically separated and removed from the structure comprising the third external connectors 601, and the fourth external connectors 603, the first semiconductor device 201, and the second semiconductor device 301.

Once the carrier substrate 101 and the adhesive layer 103 have been removed, a patterning of the polymer layer 105 may be performed in order to form first openings 905 and expose the first vias 111 (along with the associated first seed layer 107). In an embodiment the polymer layer 105 may be patterned using, e.g., a laser drilling method. In such a method a protective layer, such as a light-to-heat conversion (LTHC) layer or a hogomax layer (not separately illustrated in FIG. 9) is first deposited over the polymer layer 105. Once protected, a laser is directed towards those portions of the polymer layer 105 which are desired to be removed in order to expose the underlying first vias 111. During the laser drilling process the drill energy may be in a range from 0.1 mJ to about 30 mJ, and a drill angle of about 0 degree (perpendicular to the polymer layer 105) to about 85 degrees to normal of the polymer layer 105. In an embodiment the patterning may be formed to form first openings 905 over the first vias 111 to have a first width of between about 100 μm and about 300 μm, such as about 200 μm.

In another embodiment, the polymer layer 105 may be patterned by initially applying a photoresist (not individually illustrated in FIG. 9) to the polymer layer 105 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 105 are removed with, e.g., a dry etch process. However, any other suitable method for patterning the polymer layer 105 may be utilized.

Figure 10:
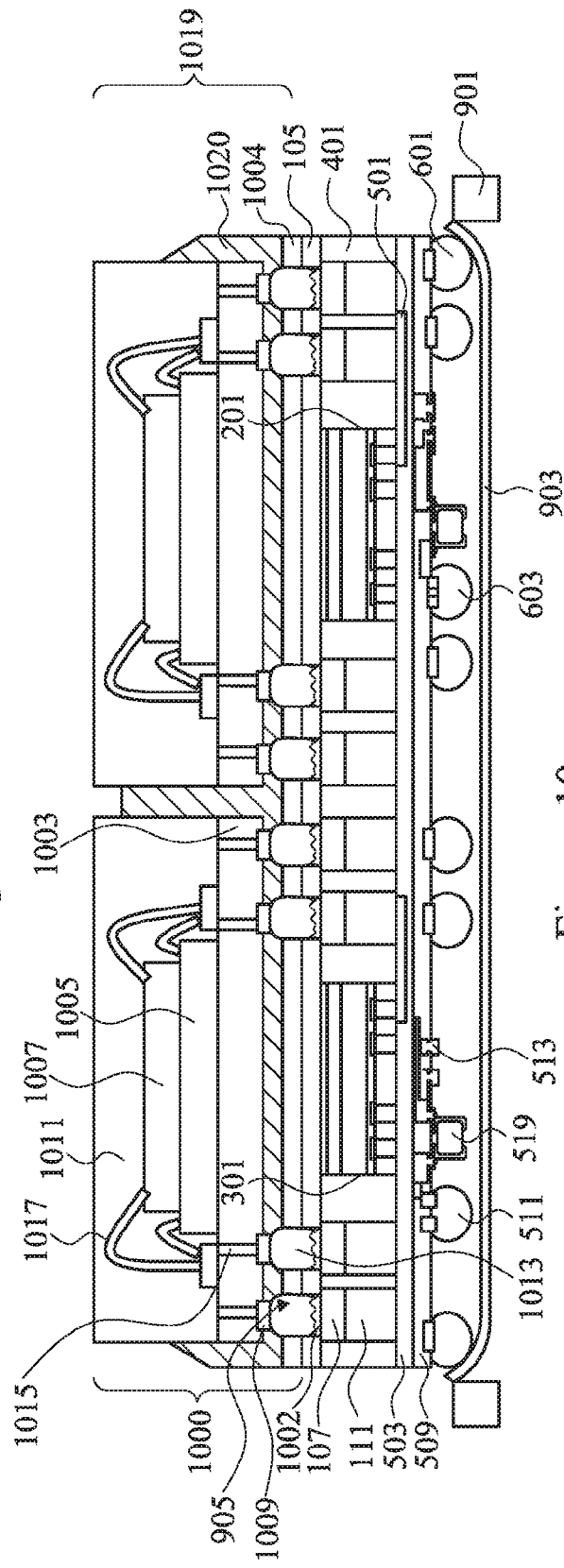
FIG. 10 illustrates a bonding of a package in accordance with some embodiments.

FIG. 10 illustrates a placement of a backside ball pad 1002 within the first openings 905 in order to protect the now exposed first vias 111. In an embodiment the backside ball pads 1002 may comprise a conductive material such as solder on paste or an oxygen solder protection (OSP), although any suitable material may be utilized. In an embodiment the backside ball pads 1002 may be applied using a stencil, although any suitable method of application may be utilized, and then reflowed in order to form a bump shape.

FIG. 10 additionally illustrates a placement and patterning of a backside protection layer 1004 over the backside ball pads 1002, effectively sealing the joint between the backside ball pads 1002 and the first vias 111 from intrusion by moisture. In an embodiment the backside protection layer 1004 may be a protective material such as a PBO, Solder Resistance (SR), Lamination Compound (LC) tape, Ajinomoto build-up film (ABF), non-conductive paste (NCP), non-conductive film (NCF), patterned underfill (PUF), warpage improvement adhesive (WIA), liquid molding compound V9, combinations of these, or the like. However, any suitable material may also be used. The backside protection layer 1004 may be applied using a process such as screen printing, lamination, spin coating, or the like, to a thickness of between about 1 μm to about 200 μm.

FIG. 10 also illustrates that, once the backside protection layer 1004 has been placed, the backside protection layer 1004 may be patterned in order to expose the backside ball pads 1002. In an embodiment the backside protection layer 1004 may be patterned using, e.g., a laser drilling method, by which a laser is directed towards those portions of the backside protection layer 1004 which are desired to be removed in order to expose the backside ball pads 1002. During the laser drilling process the drill energy may be in a range from 0.1 mJ to about 30 mJ, and a drill angle of about 0 degree (perpendicular to the backside protection layer 1004) to about 85 degrees to normal of the backside protection layer 1004. In an embodiment the patterning may be formed to form openings over the backside ball pads 1002, and the openings may be formed to have a diameter of between about 30 μm and about 300 μm, such as about 150 μm.

In another embodiment, the backside protection layer 1004 may be patterned by initially applying a photoresist (not individually illustrated in FIG. 10) to the backside protection layer 1004 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the backside protection layer 1004 are removed with, e.g., a dry etch process. However, any other suitable method for patterning the backside protection layer 1004 may be utilized.

FIG. 10 also illustrates a bonding of the backside ball pads 1002 to a first package 1000 and a placement of a second underfill material 1020. In an embodiment the first package 1000 may comprise a third substrate 1003, a third semiconductor device 1005, a fourth semiconductor device 1007 (bonded to the third semiconductor device 1005), third contact pads 1009, a second encapsulant 1011, and fifth external connections 1013. In an embodiment the third substrate 1003 may be, e.g., a packaging substrate comprising internal interconnects (e.g., through substrate vias 1015) to connect the third semiconductor device 1005 and the fourth semiconductor device 1007 to the backside ball pads 1002.

In another embodiment, the third substrate 1003 may be an interposer used as an intermediate substrate to connect the third semiconductor device 1005 and the fourth semiconductor device 1007 to the backside ball pads 1002. In this embodiment the third substrate 1003 may be, e.g., a silicon substrate, doped or undoped, or an active layer of a silicon-on-insulator (SOI) substrate. However, the third substrate 1003 may be a glass substrate, a ceramic substrate, a polymer substrate, or any other substrate that may provide a suitable protection and/or interconnection functionality. These and any other suitable materials may be used for the third substrate 1003.

The third semiconductor device 1005 may be a semiconductor device designed for an intended purpose such as being a logic die, a central processing unit (CPU) die, a memory die (e.g., a DRAM die), combinations of these, or the like that is intended to be utilized with the second semiconductor device 301 (which may be part of a system on chip package. In an embodiment the third semiconductor device 1005 comprises integrated circuit devices, such as transistors, capacitors, inductors, resistors, first metallization layers (not shown), and the like, therein, as desired for a particular functionality. In an embodiment the third semiconductor device 1005 is designed and manufactured to work in conjunction with or concurrently with the first semiconductor device 201.

The fourth semiconductor device 1007 may be similar to the third semiconductor device 1005. For example, the fourth semiconductor device 1007 may be a semiconductor device designed for an intended purpose (e.g., a DRAM die) and comprising integrated circuit devices for a desired functionality. In an embodiment the fourth semiconductor device 1007 is designed to work in conjunction with or concurrently with the first semiconductor device 201 and/or the third semiconductor device 1005.

The fourth semiconductor device 1007 may be bonded to the third semiconductor device 1005. In an embodiment the fourth semiconductor device 1007 is only physically bonded with the third semiconductor device 1005, such as by using an adhesive. In this embodiment the fourth semiconductor device 1007 and the third semiconductor device 1005 may be electrically connected to the third substrate 1003 using, e.g., wire bonds 1017, although any suitable electrical bonding may be utilized.

In an embodiment the fourth semiconductor device 1007 may be bonded to the third semiconductor device 1005 both physically and electrically. In this embodiment the fourth semiconductor device 1007 may comprise sixth external connections (not separately illustrated in FIG. 10) that connect with seventh external connection (also not separately illustrated in FIG. 10) on the third semiconductor device 1005 in order to interconnect the fourth semiconductor device 1007 with the third semiconductor device 1005.

The third contact pads 1009 may be formed on the third substrate 1003 to form electrical connections between the third semiconductor device 1005 and, e.g., the fifth external connections 1013. In an embodiment the third contact pads 1009 may be formed over and in electrical contact with electrical routing (such as through substrate vias 1015) within the third substrate 1003. The third contact pads 1009 may comprise aluminum, but other materials, such as copper, may be used. The third contact pads 1009 may be formed using a deposition process, such as sputtering, to form a layer of material (not shown) and portions of the layer of material may then be removed through a suitable process (such as photolithographic masking and etching) to form the third contact pads 1009. However, any other suitable process may be utilized to form the third contact pads 1009. The third contact pads 1009 may be formed to have a thickness of between about 0.5 μm and about 4 μm, such as about 1.45 μm.

The second encapsulant 1011 may be used to encapsulate and protect the third semiconductor device 1005, the fourth semiconductor device 1007, and the third substrate 1003. In an embodiment the second encapsulant 1011 may be a molding compound and may be placed using a molding device (not illustrated in FIG. 10). For example, the third substrate 1003, the third semiconductor device 1005, and the fourth semiconductor device 1007 may be placed within a cavity of the molding device, and the cavity may be hermetically sealed. The second encapsulant 1011 may be placed within the cavity either before the cavity is hermetically sealed or else may be injected into the cavity through an injection port. In an embodiment the second encapsulant 1011 may be a molding compound resin such as polyimide, PPS, PEEK, PES, a heat resistant crystal resin, combinations of these, or the like.

Once the second encapsulant 1011 has been placed into the cavity such that the second encapsulant 1011 encapsulates the region around the third substrate 1003, the third semiconductor device 1005, and the fourth semiconductor device 1007, the second encapsulant 1011 may be cured in order to harden the second encapsulant 1011 for optimum protection. While the exact curing process is dependent at least in part on the particular material chosen for the second encapsulant 1011, in an embodiment in which molding compound is chosen as the second encapsulant 1011, the curing could occur through a process such as heating the second encapsulant 1011 to between about 100° C. and about 130° C., such as about 125° C. for about 60 sec to about 3000 sec, such as about 600 sec. Additionally, initiators and/or catalysts may be included within the second encapsulant 1011 to better control the curing process.

However, as one having ordinary skill in the art will recognize, the curing process described above is merely an exemplary process and is not meant to limit the current embodiments. Other curing processes, such as irradiation or even allowing the second encapsulant 1011 to harden at ambient temperature, may be used. Any suitable curing process may be used, and all such processes are fully intended to be included within the scope of the embodiments discussed herein.

In an embodiment the fifth external connections 1013 may be formed to provide an external connection between the third substrate 1003 and, e.g., the backside ball pads 1002. The fifth external connections 1013 may be contact bumps such as microbumps or controlled collapse chip connection (C4) bumps and may comprise a material such as tin, or other suitable materials, such as silver or copper. In an embodiment in which the fifth external connections 1013 are tin solder bumps, the fifth external connections 1013 may be formed by initially forming a layer of tin through any suitable method such as evaporation, electroplating, printing, solder transfer, ball placement, etc, to a thickness of, e.g., about 100 μm. Once a layer of tin has been formed on the structure, a reflow is performed in order to shape the material into the desired bump shape.

Once the fifth external connections 1013 have been formed, the fifth external connections 1013 are aligned with and placed into physical contact with the backside ball pads 1002, and a bonding is performed. For example, in an embodiment in which the fifth external connections 1013 are solder bumps, the bonding process may comprise a reflow process whereby the temperature of the fifth external connections 1013 is raised to a point where the fifth external connections 1013 will liquefy and flow, thereby bonding the first package 1000 to the backside ball pads 1002 once the fifth external connections 1013 resolidify.

FIG. 10 additionally illustrates the bonding of a second package 1019 to the backside ball pads 1002. In an embodiment the second package 1019 may be similar to the first package 1000, and may be bonded to the backside ball pads 1002 utilizing similar processes. However, the second package 1019 may also be different from the first package 1000.

Once the first package 1000 and the second package 1019 have been bonded, the second underfill material 1020 may be placed in order to help protect the first package 1000 and the second package 1019 from further environmental and operational stresses. In an embodiment the second underfill material 1020 may made from and dispensed similar to the underfill material 521 described above with respect to FIG. 5, such as by being a liquid epoxy dispensed using an injection method. However, any suitable material and method of dispensing may alternatively be utilized.

Figure 11:
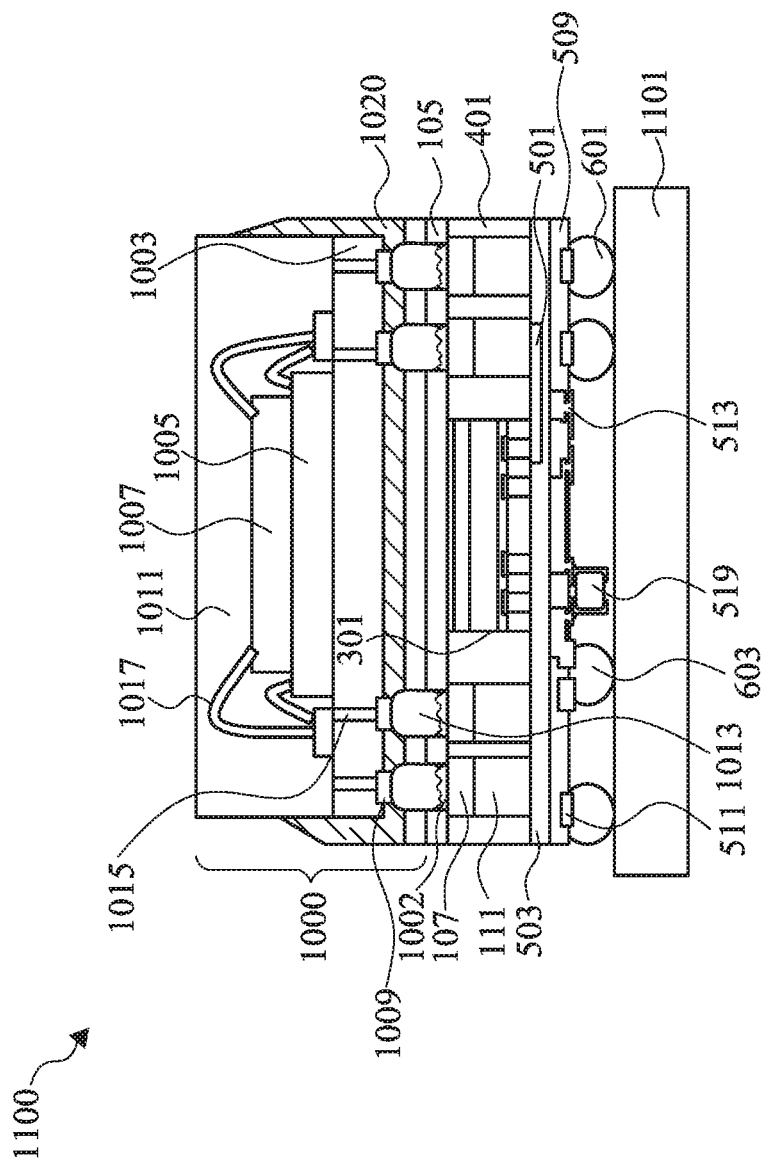
FIG. 11 illustrates a singulation process in accordance with some embodiments.

FIG. 11 illustrates a debonding of the third external connectors 601 from the ring structure 901 and a singulation of the structure to form a first integrated fan out package-on-package (InFO-POP) structure 1100. In an embodiment the third external connectors 601 may be debonded from the ring structure 901 by initially bonding the first package 1000 and the second package 1019 to a second ring structure using, e.g., a second ultraviolet tape (not separately illustrated in FIG. 11). Once bonded, the ultraviolet tape 903 may be irradiated with ultraviolet radiation and, once the ultraviolet tape 903 has lost its adhesiveness, the third external connectors 601 may be physically separated from the ring structure 901.

Once debonded, a singulation of the structure to form the first InFO-POP structure 1100 is performed. In an embodiment the singulation may be performed by using a saw blade (not shown) to slice through the first encapsulant 401 and the polymer layer 105 between the first vias 111, thereby separating one section from another to form the first InFO-POP structure 1100 with the second semiconductor device 301. However, as one of ordinary skill in the art will recognize, utilizing a saw blade to singulate the first InFO-POP structure 1100 is merely one illustrative embodiment and is not intended to be limiting. Alternative methods for singulating the first InFO-POP structure 1100, such as utilizing one or more etches to separate the first InFO-POP structure 1100, may be utilized. These methods and any other suitable methods may be utilized to singulate the first InFO-POP structure 1100.

FIG. 11 additionally illustrates a placement of the first InFO-POP structure 1100 onto a printed circuit board (PCB) 1101. In an embodiment the first InFO-POP structure 1100 may be bonded to the PCB 1101 by aligning the third external connector 601 and the fourth external connectors 603 (if remaining) with connections on the PCB 1101 (not separately illustrated in FIG. 11). Once aligned, the third external connector 601 and the fourth external connectors 603 may be reflowed in order to physically and electrically bond the PCB 1101 to the first InFO-POP structure 1100. However, any suitable process may be used to bond the first InFO-POP structure 1100 to the PCB 1101.

Figure 12A:
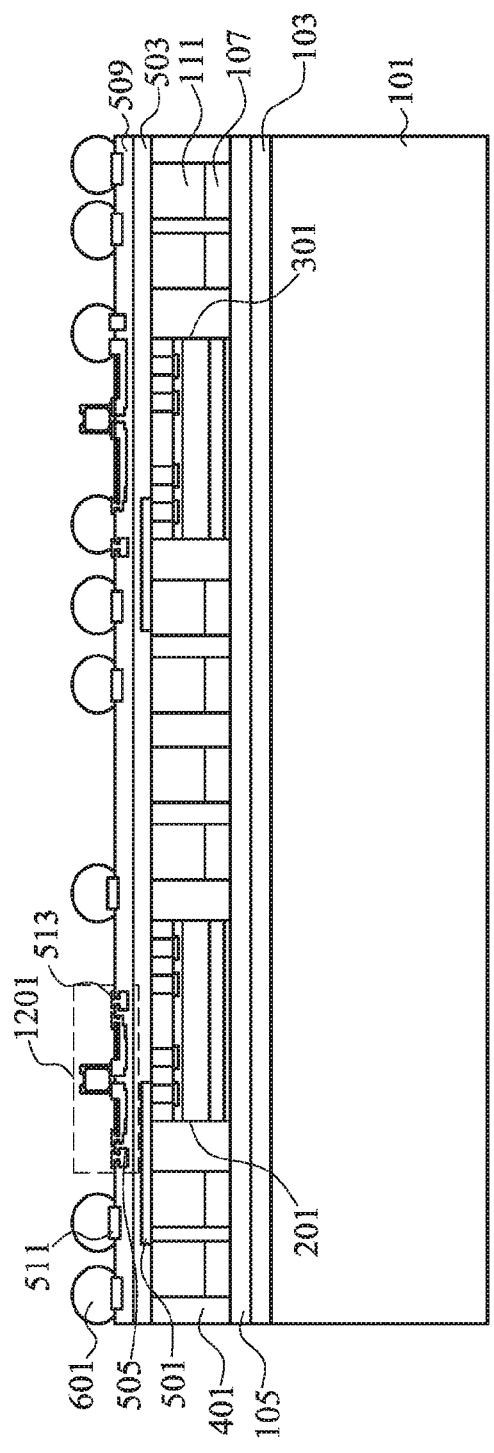
FIGS. 12A-12B illustrate an embodiment in which multiple external connections are removed in accordance with some embodiments.
Figure 12B:
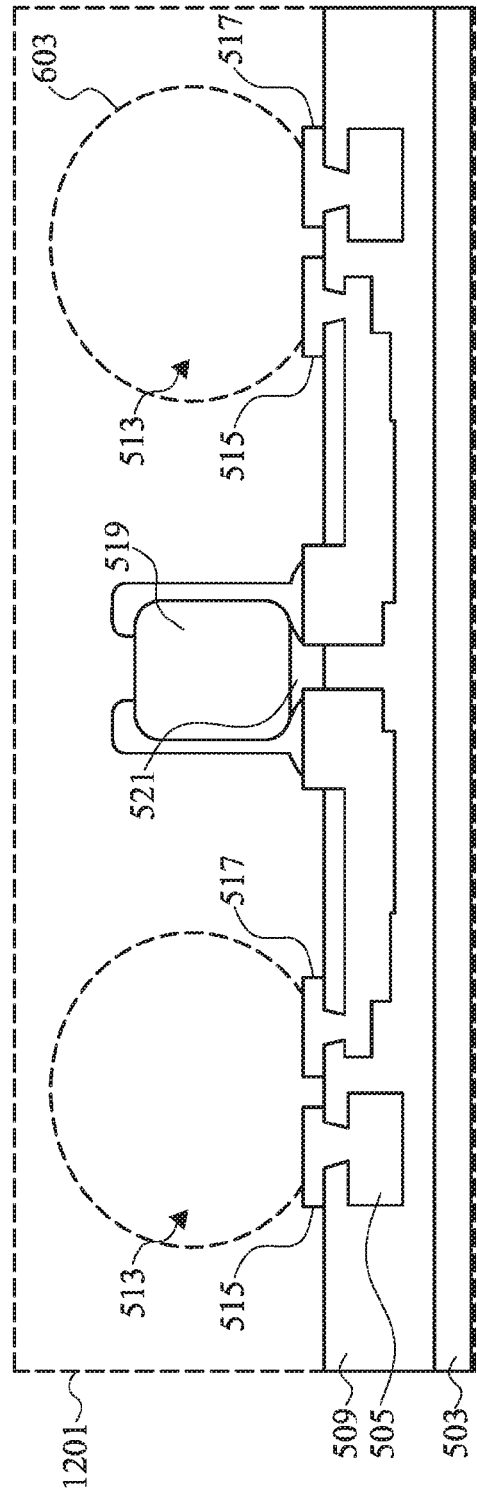

FIGS. 12A-12B illustrate another embodiment in which, instead of removing only a single one of the fourth external connectors 603 (which is sufficient to functionally remove the surface device 519 from the remainder of the structure), a second one of the fourth external connectors 603 (whose removal is illustrated by the dashed outline of the fourth external connector 603) may also be removed in order to completely electrically isolate the surface device 519, with FIG. 12B illustrating a close-up view of the dashed box 1201 in FIG. 12A. In this embodiment the second one of the fourth external connectors 603 may be located on an opposite side within the electrical circuit of the surface device 519 from the first one of the fourth external connectors 603. In an embodiment the second once of the fourth external connectors 603 may be removed in a similar fashion as described above with respect to FIGS. 8A-8B. For example, the second once of the fourth external connectors 603 may be removed using a desoldering process such as a heat gun and a suction pump in order to electrically disconnect the first section 515 and the second section 517 within the terminal UBM 513. However, any suitable desoldering process may be utilized.

By removing a second fourth external connector 603, additional ones or all of the electrical connections between the surface device 519 and the terminal RDL 505 and, hence, the remainder of the structure, may be removed, and the surface device 519 may be completely isolated electrically. By completely isolating the surface device 519, the surface device 519 (which has been tested to be defective) may be functionally removed from service without also being physically removed, thereby avoiding the expensive and inefficient process of physically removing the surface device 519.

FIG. 13 illustrates an embodiment that may be used to save additional space on the surface of the structure. In this embodiment the surface device 519 is electrically connected on a first side to a first UBM 511 with an overlying third external connector 601 and is electrically connected on a second side to a terminal UBM 513 with an overlying fourth external connector 603. However, in this embodiment at least one of the terminal UBMs 513 and up to all of the terminal UBMs 513, may be manufactured such that the at least one terminal UBM 513 has a smaller dimension than the first UBMs 511. For example, in an embodiment the terminal UBMs 513 with the smaller dimension may have a surface area (when viewed from a top down perspective) of less than or equal to about 60% of the UBMs 511. In another embodiment in which the first UBMs 511 have a diameter that is the first distance $D_1$ of between about 150 µm and about 250 µm, the at least one terminal UBM 513 may have a diameter across both the first section 515 and the second section 517 of a fourth distance $D_4$ of between about 100 µm and about 150 µm. However, any suitable dimensions may also be utilized.

Figure 14:
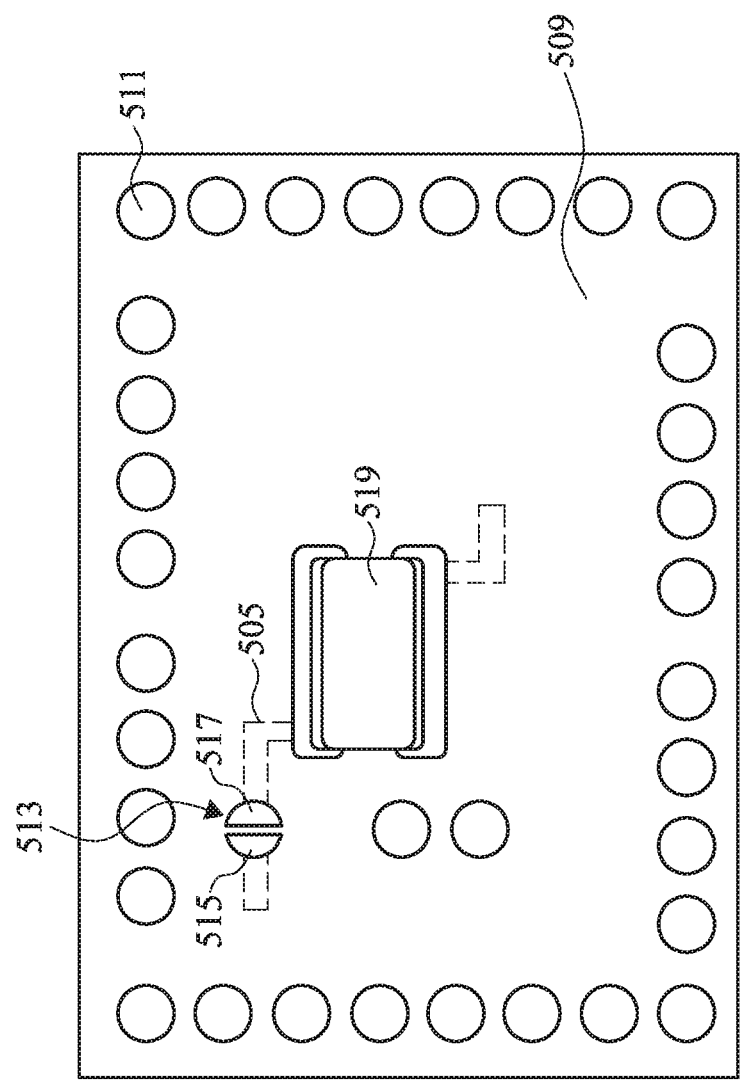
FIG. 14 illustrates a top down view of one embodiment of a surface device in accordance with some embodiments.

FIG. 14 illustrates a top down view of one embodiment of the surface device 519 that is electrically connected to one terminal UBM 513 with the first section 515 and the second section 517, with each of the first section 515 and the second section 517 having the half-circle shapes as described above. As can be seen in this top-down figure, the surface device 519 is connected to the terminal UBM 513 through the terminal RDL 505 (shown in FIG. 14 as being under the fourth passivation layer 509 with the dashed lines and, after the surface device 519 has been tested and been found defective or otherwise unusable, the fourth external connector 603 that had been attached to the terminal UBM 513 has been removed in order to disconnect the surface device 519 from the rest of the device.

Figure 15:
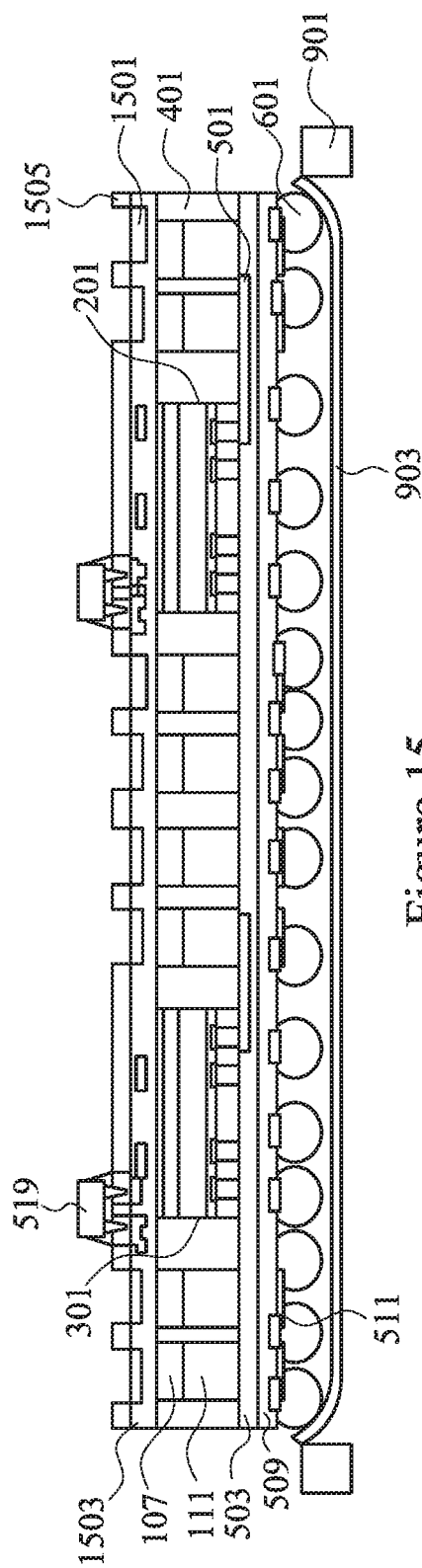
FIG. 15 illustrates an embodiment in which the surface device is bonded through the polymer layer in accordance with some embodiments.

FIG. 15 illustrates another embodiment in which the surface device 519, instead of taking up UBM spaces that would otherwise connect to a printed circuit board (not separately illustrated) and hinder the ability to route on that side, are instead placed between the first semiconductor device 201 or the second semiconductor device 301 and the first package 1000 in order to prevent the hindrance of the routing ability. In an embodiment the surface device 519 may be placed so as to be connected to a second RDL 1501 on an opposite side of the first semiconductor device 201 and the second semiconductor device 301 from the third external connectors 601.

In an embodiment the second RDL 1501 may be formed by initially removing the polymer layer 105 from over the first semiconductor device 201 and the second semiconductor device 301. In an embodiment the removal of the polymer layer 105 may be performed using, e.g., an etch back process whereby etchants are utilized to remove the polymer layer 105 until the first vias 111 have been exposed. For example, in an embodiment in which the polymer layer 105 is PBO, an etchant may be utilized in a wet etch process to remove the polymer layer 105.

However, as one of ordinary skill in the art will recognize, the wet etch process described above is intended to be illustrative and is not intended to limit the embodiments. Rather, any suitable removal process, such as a chemical mechanical polish or a low debond energy process may be used in order to save costs related to the protection layer. All such processes are fully intended to be included within the scope of the embodiments.

Once the first vias 111, the first semiconductor device 201, and the second semiconductor device 301 have been exposed, the second RDL 1501 may be formed to interconnect the first vias 111 and the subsequently formed fifth external connections 1013 (not seen in this embodiment illustrated in FIG. 15 but illustrated below with respect to FIGS. 16A-16B). In an embodiment the second RDL 1501 may be formed as described above with respect to the first RDL 501. For example, a seed layer may be formed, a photoresist may be placed and patterned over the seed layer, and the second RDL 1501 may be plated onto the seed layer within the openings of the photoresist before the photoresist is removed.

Once the second RDL 1501 has been formed, a fifth passivation layer 1503 may be formed over the second RDL 1501 in order to protect the second RDL 1501. In an embodiment the fifth passivation layer 1503 may be of similar materials and formed using similar processes as the third passivation layer 503, although the fifth passivation layer 1503 may also be formed of any suitable methods by any suitable processes.

Additionally, while only a single one of the second RDL 1501 and the fifth passivation layer 1503 are illustrated in FIG. 15, this is intended to be illustrative and is not intended to be limiting. Rather, if desired, additional RDL layers and passivation layers (not separately illustrated in FIG. 15) may also be formed after the second RDL 1501 and the fifth passivation layer 1503 have been formed. Any suitable number of RDL layers and passivation layers may be utilized, and all such numbers are fully intended to be included within the scope of the embodiments.

Once the second RDL 1501 and the fifth passivation layer 1503 have been formed, a sixth passivation layer 1505 may be formed to protect the second RDL 1501 along with the other underlying structures. In an embodiment the sixth passivation layer 1505 may be similar to the third passivation layer 503. For example, the sixth passivation layer 1505 may be PBO placed using, e.g., a spin-on process. However, any suitable material or method of manufacture may be utilized.

Once the sixth passivation layer 1505 has been formed, the sixth passivation layer 1505 is patterned in order to expose portions of the second RDL 1501 for further connections. In an embodiment the sixth passivation layer 1505 may be patterned as described above with respect to the patterning of the polymer layer 105 described in FIG. 9. For example, the sixth passivation layer 1505 may be patterned using a laser patterning process or a photolithographic masking and etching process, although any suitable patterning process may be utilized.

After the sixth passivation layer 1505 has been patterned, the surface device 519 may be mounted over the sixth passivation layer 1505 and in electrical contact with the second RDL 1501. In an embodiment the surface device 519 may be mounted as described above with respect to FIG. 5A. For example, flux may be applied to the surface device 519 using a flux dip, the surface device 519 may be positioned using a pick and place process, a reflow may be performed, and the flux may be cleaned. However, any suitable method of mounting and bonding the surface device 519 may be utilized.

Optionally in this embodiment, second UBMs and second terminal UBMs (not separately illustrated in FIG. 15) may be formed within the openings of the sixth passivation layer 1505 in order to form the fuse line so that, if the surface device 519 does not pass a test the surface device 519 may be electrically removed from the remainder of the structure. In an embodiment the second UBMs and the second terminal UBMs may be formed as described above with respect to the first UBMs 511 and the terminal UBMs 513. Additionally, the second terminal UBMs may be utilized to connect, test and, if desired after testing, electrically disconnect the surface device 519 from the remainder of the structure without physically removing the surface device 519.

Figure 16A:
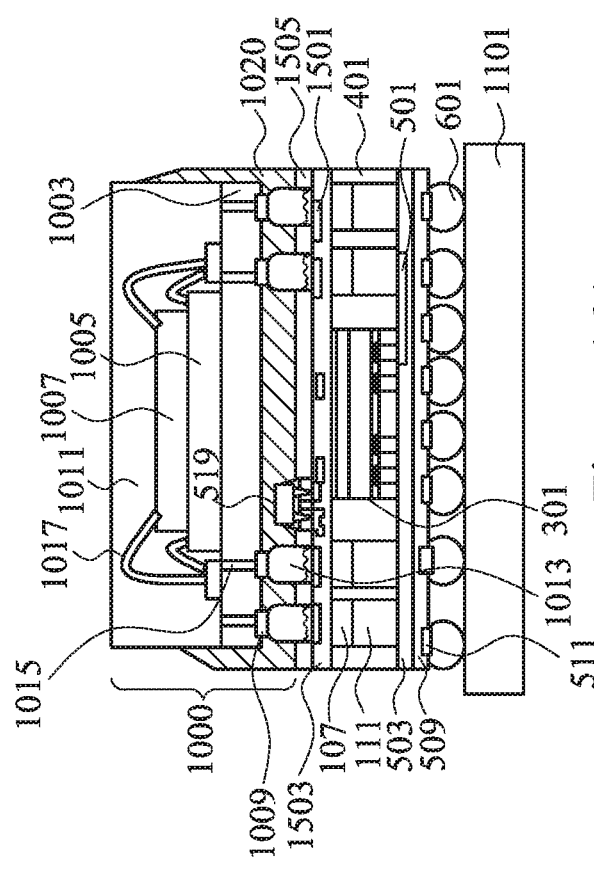
FIGS. 16A-16B illustrate a bonding of a package when the surface device is bonded through the polymer layer in accordance with some embodiments.
Figure 16B:
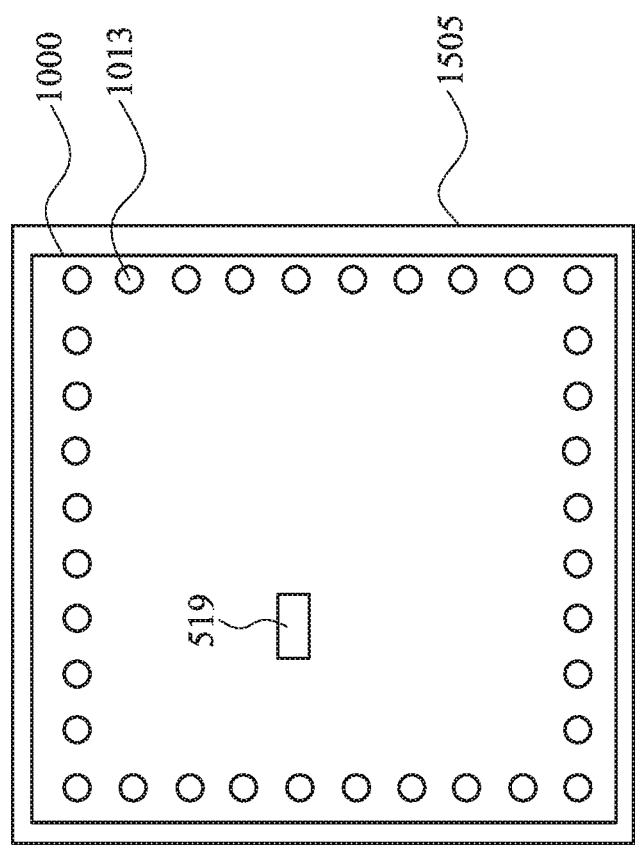

FIGS. 16A-16B illustrate that, once the surface device 519 has been mounted, the first package 1000 may be mounted in electrical connection with the second RDL 1501. In this embodiment the surface device 519 is located between the second RDL 1501 and the first package 1000. The first package 1000 may be mounted as described above with respect to FIG. 10, although any suitable method of bonding the first package 1000 may be utilized. By mounting the surface device 519 between the first package 1000 and the second RDL 1501, additional space on an opposite side of the first vias 111 is not taken up, and additional routing and connectivity on that side may be achieved.

FIG. 16B illustrates a top-down view of one embodiment in which the surface device 519 has been mounted between the first package 1000 and the second RDL 1501. As can be seen the surface device 519 may be mounted in a region that is not crowded with external connectors, such as the fifth external connections 1013 and the third external connectors 601. In particular, the surface device 519 is located on an opposite side of the encapsulant 401 from the third external connectors 601, and the fifth external connections 1013 may be arranged along an exterior region of the package 1000, allowing the surface device 519 to be placed in an interior region of the package 1000. As such, the surface device 519 may be located in a region without having to reduce or interfere with the placement of any of the external connectors, thereby increasing the overall efficiency and ability to route and place external connectors.

Figure 17A:
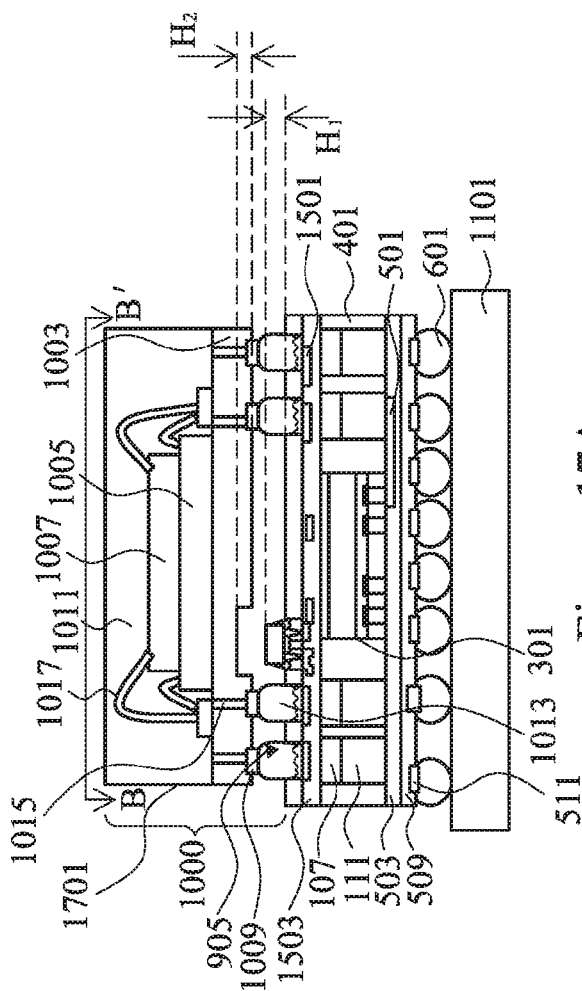
FIGS. 17A-17B illustrate a patterning of a substrate to accommodate the surface device in accordance with some embodiments.
Figure 17B:
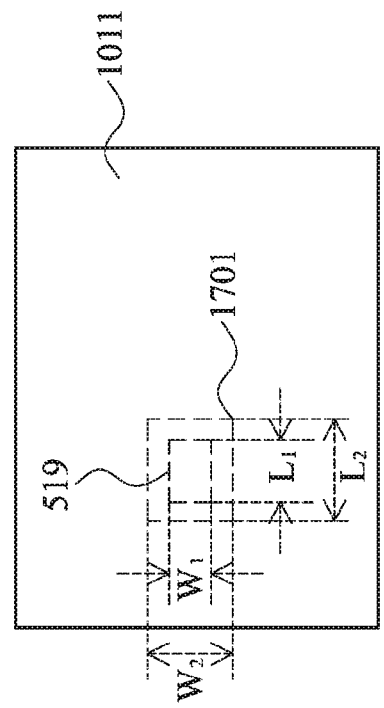

FIGS. 17A-17B illustrate an embodiment in which the third substrate 1003 is customized in order to better accept the presence of the surface device 519, with FIG. 17B illustrating a top-down view of FIG. 17A along line B-B'. In this embodiment a slot 1701 is formed within the third substrate 1003 so as to ensure that the presence of the surface device 519 does not adversely affect the bonding of the first package 1000. In an embodiment the slot 1701 may be formed by applying a photoresist (not separately illustrated) to the third substrate 1003 prior to bonding the first package 1000. Once the photoresist has been applied, the photoresist may be patterned in order to expose the region of the third substrate 1003 where the slot 1701 is desired, and an anisotropic etch such as a reactive ion etch is performed using the patterned photoresist as a mask in order to form the slot 1701.

In an embodiment the slot 1701 is formed in order to have a shape that accommodates the surface device 519. As such, as illustrated in FIG. 17B, which illustrates the second encapsulant 1011 along with only the slot 1701 and the surface device 519 for clarity, while the size and shape of the slot 1701 is dependent at least in part on the size and shape of the surface device 519, in an embodiment in which the surface device 519 has a first length $L_1$ of about 0.4 mm and a first width $W_1$ of about 0.2 mm, the slot 1701 may have a second length $L_2$ of between about 0.5 mm and about 10 mm, and may have a second width $W_2$ of between about 0.5 mm and about 10 mm. Additionally, in an embodiment in which the surface device 519 has a first height $H_1$ (over the sixth passivation layer 1505) of between about 20 μm and about 100 μm, the slot 1701 may have a second height $H_2$ of between about 20 μm and about 150 μm. By forming the slot 1701 the surface device 519 may be placed between the sixth passivation layer 1505 and the first package 1000 without interfering with the spacing between the sixth passivation layer 1505 and the first package 1000 and will not cause additional problems.

Figure 18:
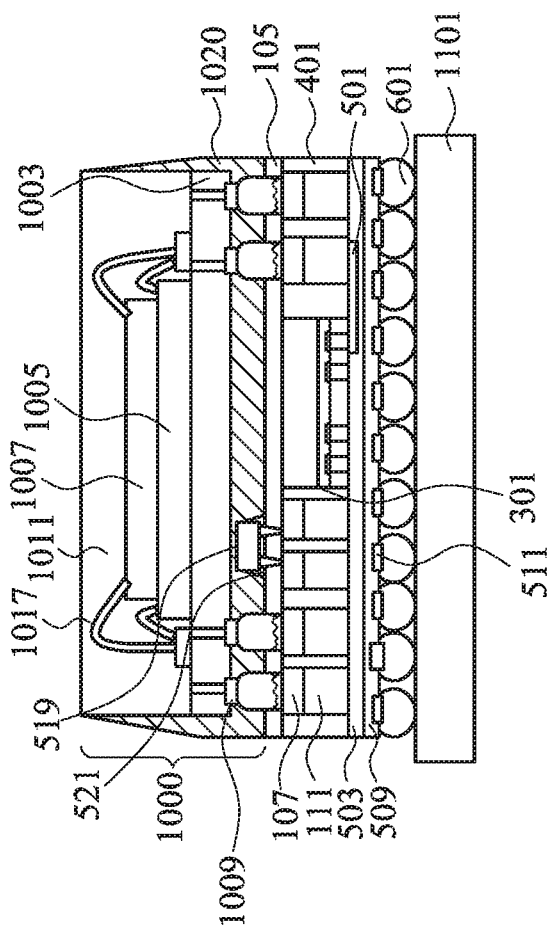
FIG. 18 illustrates a singulation process in accordance with some embodiments.

FIG. 18 illustrates yet another embodiment in which the surface device 519 is connected directly to the first vias 111 instead of being connected to a redistribution layer. In this embodiment the second RDL 1501 is not formed, and the openings are formed through the polymer layer 105. However, in this embodiment two of the first vias 111 are located, formed, and exposed so that the surface device 519 may be mounted directly to the first vias 111 and not to an underlying redistribution layer. The first vias 111 directly connect the surface device 519 to the first RDL 501, although the surface device 519 is located between the first vias 111 and the first package 1000. By connecting directly to the first vias 111, the manufacturing of the second RDL 1501 may be avoided and the overall manufacturing process may be simplified.

Figure 19:
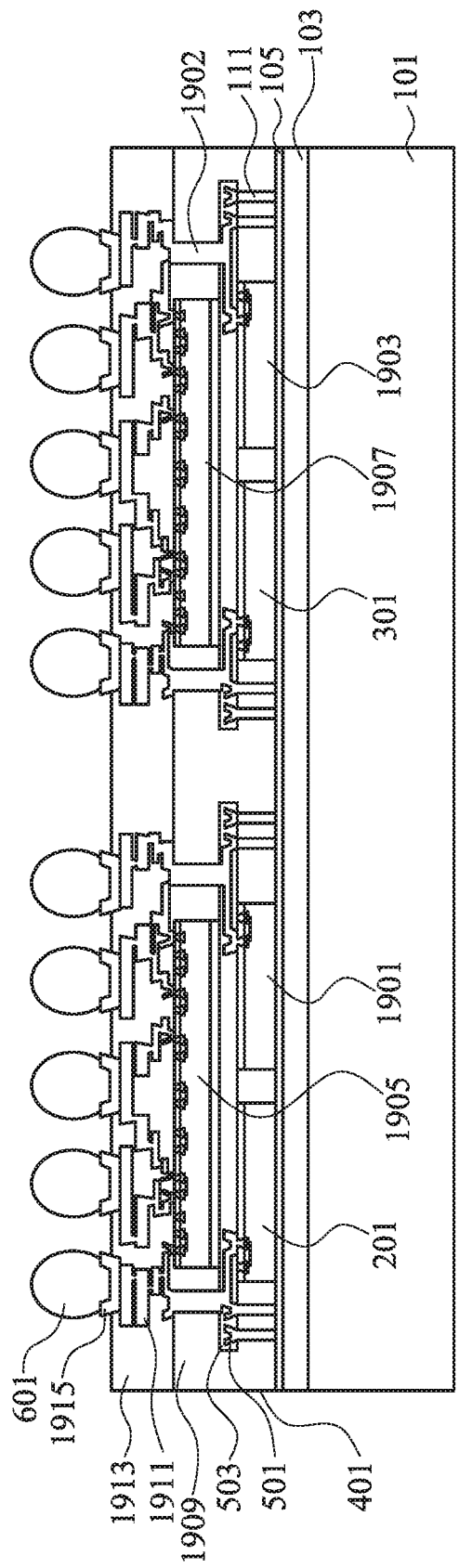
FIG. 19 illustrates a multi-fan out process in accordance with some embodiments.

FIG. 19 illustrates yet another embodiment in which the surface device 519 is utilized in a multi-fan out process of manufacturing a semiconductor device. In this embodiment a fifth semiconductor device 1901 may be placed alongside the first semiconductor device 201 and a sixth semiconductor device 1903 may be placed alongside the second semiconductor device 301. The fifth semiconductor device 1901 and the sixth semiconductor device 1903 may be similar to the first semiconductor device 201 and the second semiconductor device 301, and may be designed to work in conjunction with the first semiconductor device 201 or the second semiconductor device 301.

Once in place, the first vias 111, the first semiconductor device 201, the second semiconductor device 301, the fifth semiconductor device 1901 and the sixth semiconductor device 1903 are encapsulated with the first encapsulant 401, planarized, and the first RDL 501 is formed. In an embodiment the first encapsulant 401 may be applied and planarized as described above with respect to FIG. 4. For example, the first semiconductor device 201, the second semiconductor device 301, the fifth semiconductor device 1901 and the sixth semiconductor device 1903 may be placed into a molding chamber and the first encapsulant 401 is introduced and then cured prior to a process such as a chemical mechanical polishing process being used to planarize the first encapsulant 401 and expose the first vias 111, the first semiconductor device 201, the second semiconductor device 301, the fifth semiconductor device 1901 and the sixth semiconductor device 1903.

Once planarized, the first RDL 501 may be formed in electrical connection with the first vias 111, the first semiconductor device 201, the second semiconductor device 301, the fifth semiconductor device 1901 and the sixth semiconductor device 1903. In an embodiment the first RDL 501 may be formed as described above with respect to FIG. 5. For example, a seed layer may be applied, a photoresist is deposited and patterned over the seed layer, conductive material is deposited into the photoresist, the photoresist is removed, and exposed portions of the seed layer are removed. However, any suitable process may be utilized.

Once the first RDL 501 has been formed, the third passivation layer 503 may be formed in order to protect the first RDL 501, and the third passivation layer 503 may be patterned in order to expose portions of the first RDL 501 for further processing. After the third passivation layer 503 has been formed, second vias 1902 may be formed in electrical connection with the first RDL 501. In an embodiment the second vias 1902 may be formed in a similar fashion as the first vias 111 described above with respect to FIG. 1. For example, in one embodiment a seed layer is deposited, a photoresist is deposited and patterned over the seed layer, conductive material is deposited into the photoresist, the photoresist is removed, and exposed portions of the seed layer are removed. However, any suitable method may be utilized to form the second vias 1902.

After the second vias 1902 have been formed, a seventh semiconductor device 1905 may be placed between the second vias 1902 over the first semiconductor device 201 and the fifth semiconductor device 1901 and an eighth semiconductor device 1907 may be placed between the second vias 1902 over the second semiconductor device 301 and the sixth semiconductor device 1903. In an embodiment the seventh semiconductor device 1905 and the eighth semiconductor device 1907 may be similar to any of the first semiconductor device 201, the second semiconductor device 301, the fifth semiconductor device 1901 or the sixth semiconductor device 1903, and may be configured to work in conjunction with each other as desired for a particular functionality.

The seventh semiconductor device 1905 and the eighth semiconductor device 1907 may be placed in a similar fashion as the first semiconductor device 201 and the second semiconductor device 301. For example, the seventh semiconductor device 1905 and the eighth semiconductor device 1907 may be placed using a pick and place process. However, any suitable method of placing the seventh semiconductor device 1905 and the eighth semiconductor device 1907 may be utilized.

After the second vias 1902 have been formed and the seventh semiconductor device 1905 and the eighth semiconductor device 1907 have been placed, the second vias 1902, the seventh semiconductor device 1905 and the eighth semiconductor device 1907 may be encapsulated with a third encapsulant 1909. In an embodiment the third encapsulant 1909 may be similar to the first encapsulant 401, such as by being a molding compound, although any suitable material may be used.

In an embodiment the third encapsulant 1909 may be placed in a manner similar to the manner in which the first encapsulant 401 was placed as described above with respect to FIG. 4. For example, the second vias 1902, the seventh semiconductor device 1905 and the eighth semiconductor device 1907 may be placed (along with the first RDL 501 and other underlying structures) into a molding chamber, and the third encapsulant 1909 may be introduced to encapsulate the second vias 1902, the seventh semiconductor device 1905 and the eighth semiconductor device 1907 along with the first RDL 501, the first semiconductor device 201, the second semiconductor device 301, and the first encapsulant 401, with the third encapsulant 1909 being in physical contact with the third encapsulant 1909. Once in place, the third encapsulant 1909 may be cured.

After the third encapsulant 1909 has been cured, the third encapsulant 1909 may be planarized in order to remove excess material and also to form a planar surface with the second vias 1902, the seventh semiconductor device 1905 and the eighth semiconductor device 1907. In an embodiment the third encapsulant 1909 is planarized as described above with respect to FIG. 4. For example, a chemical mechanical polishing process may be utilized to planarize the third encapsulant 1909, although any suitable planarization process may be utilized.

Once planarized, a series of third RDLs 1911 and seventh passivation layers 1913 may be formed over the third encapsulant 1909 and utilized to electrically connect the seventh semiconductor device 1905, the eighth semiconductor device 1907, and the second vias 1902. In an embodiment the third RDL 1911 and the seventh passivation layers 1913 may be formed with similar materials and using similar processes as described above with respect to the first RDL 501 and the fourth passivation layer 509, although any suitable materials and methods of manufacture may be used. Once a first one of the third RDLs 1911 and the seventh passivation layers 1913 has been formed, the process may be repeated to form another one of the third RDLs 1911 and the seventh passivation layers 1913. Additionally, while multiple ones of the third RDLs 1911 and the seventh passivation layers 1913 have been illustrated in FIG. 19, any suitable number of third RDLs 1911 and the seventh passivation layers 1913 may be formed, including a single one of the third RDLs 1911 and the seventh passivation layers 1913.

Once the third RDLs 1911 and the seventh passivation layers 1913 have been formed, third UBMs 1915 may be formed in electrical connection with the third RDLs 1911. In an embodiment the third UBMs 1915 are formed of similar materials and with similar processes as the first UBMs 511 described above with respect to FIG. 5. However, any suitable materials or methods of manufacture may be used to form the third UBMs 1915.

Once the third RDL 1911 has been formed, the third external connectors 601 may be placed in electrical connection with the third UBMs 1915. In an embodiment the third external connectors 601 may be placed as described above with respect to FIG. 6. For example, the third external connectors 601 may be a ball grid array formed using a direct ball drop process, although any suitable method of manufacture may be utilized.

FIG. 20 illustrates a placement of the structure of FIG. 19 onto the ring structure 901 and the ultraviolet tape 903 and a removal of the carrier substrate 101. In an embodiment the carrier substrate 101 may be removed as described above with respect to FIG. 9. For example, the adhesive layer 103 may be irradiated and heated using, e.g., ultraviolet light until the adhesive layer 103 loses at least some of its adhesive properties, at which point the carrier substrate 101 and the adhesive layer 103 are removed. However, any suitable process for removing the carrier substrate 101 may be used.

Once the carrier substrate 101 and the adhesive layer 103 have been removed, the now exposed polymer layer 105 may be patterned in order to expose the first vias 111. In an embodiment the polymer layer 105 may be patterned as described above with respect to FIG. 9. For example, a laser drilling method may be used to form first openings 905 through the polymer layer 105 such that the first vias 111 (including the first seed layer 107) are exposed for further processing. However, any suitable method of patterning the polymer layer 105 may be utilized.

FIG. 20 also illustrates that, once the first vias 111 have been exposed through the polymer layer 105, the surface devices 519 may be placed to extend through the first openings 905 through the polymer layer 105 and bonded in electrical connection with the first vias 111. In an embodiment the surface devices 519 may be bonded as described above with respect to FIGS. 5A-5B. For example, the surface devices 519 may be bonded by sequentially dipping connectors such as solder balls of the surface device 519 into flux, using a pick-and-place tool in order to physically align the connectors of the surface device 519 with individual ones of the first vias 111, and reflowing the connectors such that the surface devices 519 are bonded to the first vias 111. Optionally, the first UBMs 511 may be formed in physical contact with the first vias 111 and the surface devices 519 may be bonded to the first UBMs 511.

FIG. 21 illustrates a singulation into a first multi-fan out package 2100. In an embodiment the singulation may be performed as described above with respect to FIG. 11. For example, a saw blade may be used to cut through the first encapsulant 401 and the third encapsulant 1909 between the first vias 111 and the second vias 1902 in order to form the first multi-fan out package 2100. However, any suitable method of singulating the structure into the first multi-fan out package 2100 may be utilized.

By utilizing the surface devices 519 within the multi-fan out package 2100, greater flexibility in the placement of the surface devices 519 may be obtained. Additionally, with the optional inclusion of the terminal UBMs 519 (not separately illustrated) along with the multi-fan out package 2100, the surface devices 519 that fail testing may be functionally removed.

In accordance with an embodiment, a method of manufacturing a semiconductor device comprising applying a first external connector to a first underbump metallization over a substrate is provided. A second external connector is applied to a first terminal underbump metallization, wherein the second external connector electrically bridges a first section of the first terminal underbump metallization and a second section of the first terminal underbump metallization that were electrically isolated prior to the applying the second external connector. The second external connector is removed without removing the first external connector, and an external device is bonded to the first external connector after the removing the second external connector, wherein the bonding is performed while the first section and the second section are electrically isolated from each other.

In accordance with another embodiment, a semiconductor device comprising vias that extend through an encapsulant and are separated from a semiconductor device by the encapsulant is provided. A passivation layer is over the vias, the encapsulant, and the semiconductor device, and a surface device is located over the passivation layer. A semiconductor package is located over the surface device such that the surface device is between the passivation layer and the semiconductor package.

In accordance with yet another embodiment, a semiconductor device comprising a first redistribution layer and a first semiconductor device located on a first side of the first redistribution layer is provided. A second semiconductor device is located on a second side of the first redistribution layer opposite the first side of the first redistribution layer. A first via extends away from the first redistribution layer in a first direction, wherein the first via is separated from the first semiconductor device by a first encapsulant. A second via extends away from the first redistribution layer in a second direction opposite the first direction, wherein the second via is separated from the second semiconductor device by a second encapsulant, wherein the first via extends through the first encapsulant, the second via extends through the second encapsulant, and the second encapsulant is in physical contact with the first encapsulant. A first surface mount device is bonded to the first via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    applying a first external connector to a first underbump metallization over a substrate:
    applying a second external connector to a first terminal underbump metallization, wherein the second external connector electrically bridges a first section of the first terminal underbump metallization and a second section of the first terminal underbump metallization that were electrically isolated prior to the applying the second external connector;
    removing the second external connector without removing the first external connector; and
    bonding an external device to the first external connector after the removing the second external connector, wherein the bonding is performed while the first section and the second section are electrically isolated from each other.

2. The method of claim 1, further comprising bonding a surface device in electrical connection with the second section of the terminal underbump metallization, prior to the removing the second external connector.

3. The method of claim 2, further comprising testing the surface device after the bonding the surface device and before the removing the second external connector, wherein the removing the second external connector is performed when the surface device fails the testing the surface device.

4. The method of claim 3, wherein the surface device is located between the external device and the substrate after the bonding the external device to the first external connector.

5. The method of claim 1, further comprising:
    applying a third external connector to a second terminal underbump metallization, wherein the third external connector electrically bridges a third section of the second terminal underbump metallization and a fourth section of the second terminal underbump metallization that were electrically isolated prior to the applying the third external connector; and
    removing the third external connector without removing the first external connector.

6. The method of claim 1, wherein the first underbump metallization has a different dimension than the first terminal underbump metallization.

7. The method of claim 1, wherein the first section and the second section are separated by a distance of at least 10 µm.

8. A method of manufacturing a semiconductor device, the method comprising:
    forming a redistribution layer over a semiconductor device and vias, wherein the vias extend through an encapsulant and are separated from the semiconductor device by the encapsulant;
    bonding a surface device to be in electrical connection with a first portion of the redistribution layer, wherein the first portion is electrically separated from a second portion of the redistribution layer;

electrically connecting the first portion of the redistribution layer with the second portion of the redistribution layer by applying a solder ball;

testing the surface device;

electrically disconnecting the first portion of the redistribution layer from the second portion of the redistribution layer by removing the solder ball when the surface device fails the test; and bonding an external device in electrical connection with the redistribution layer, wherein the surface device remains between the redistribution layer and the external device.

9. The method of claim 8, wherein the electrically connecting the first portion of the redistribution layer with the second portion of the redistribution layer by applying the solder ball further comprises applying the solder ball to electrically bridge a first section of an underbump metallization with a second section of the underbump metallization physically separated from the first section of the underbump metallization.

10. The method of claim 9, further comprising a second underbump metallization, wherein the second underbump metallization and the first underbump metallization have a same width.

11. The method of claim 9, further comprising a second underbump metallization, wherein the second underbump metallization and the first underbump metallization have different widths.

12. The method of claim 11, wherein the second underbump metallization has a larger width than the first underbump metallization.

13. The method of claim 8, further comprising, electrically disconnecting a third portion of the redistribution layer and a fourth portion of the redistribution layer by removing a second solder ball when the surface device fails the test.

14. The method of claim 8, wherein the removing the first solder ball is performed with a desoldering process.

15. A method of manufacturing a semiconductor device, the method comprising:

encapsulating a first semiconductor device and a first via with an encapsulant, wherein the first semiconductor device is separated from the first via by the encapsulant;

forming a redistribution layer over the first semiconductor device, the first via, and the encapsulant, wherein a first portion of the redistribution layer is electrically isolated from a second portion of the redistribution layer;

bonding a surface device over the first portion of the redistribution layer; and bonding an external device over the surface device and in electrical connection with the second portion of the redistribution layer, wherein the surface device remains bonded over the first portion of the redistribution layer, and is electrically separated from the external device after the surface device fails a device test.

16. The method of claim 15, wherein the external device further comprises:

a substrate;

through vias extending through the substrate; and a second semiconductor device bonded to the substrate and electrically connected to the through vias.

17. The method of claim 16, wherein the substrate has an opening located over the surface device.

18. The method of claim 15, wherein the surface device is electrically connected to the first via.

19. The method of claim 15, wherein the surface device is electrically connected to the second portion of the redistribution layer during the device test.

20. The method of claim 15, further comprising a second redistribution layer on an opposite side of the encapsulant from the redistribution layer.

* * * * *